US012660478B2

(12) United States Patent

Chu et al.

(10) Patent No.: US 12,660,478 B2

(45) Date of Patent: Jun. 16, 2026

(54) ELECTROLUMINESCENT DISPLAY DEVICE

(71) Applicant: LG Display Co., Ltd., Seoul (KR)

(72) Inventors: Kyoyeol Chu, Goyang-si (KR); Hyuntae Byun, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 647 days.

(21) Appl. No.: 17/984,999

(22) Filed: Nov. 10, 2022

(65) Prior Publication Data

US 2023/0189551 A1 Jun. 15, 2023

(30) Foreign Application Priority Data

Dec. 14, 2021 (KR) ........................ 10-2021-0178550

(51) Int. Cl.
 *H10K 59/80* (2023.01)
 *H10K 59/122* (2023.01)
(52) U.S. Cl.
 CPC ......... *H10K 59/873* (2023.02); *H10K 59/122* (2023.02)
(58) Field of Classification Search
 CPC ... H10K 50/844; H10K 50/122; H10K 50/873
 See application file for complete search history.

(56) References Cited

U.S. PATENT DOCUMENTS

| | | | |
|---|---|---|---|
| 10,084,019 B2 | 9/2018 | Shim et al. | |
| 2017/0012246 A1 | 1/2017 | Onimaru et al. | |
| 2018/0026225 A1 | 1/2018 | Kwon et al. | |
| 2018/0138450 A1 | 5/2018 | Park et al. | |
| 2018/0151838 A1* | 5/2018 | Park ..................... | G06F 3/0412 |
| 2020/0212140 A1* | 7/2020 | Huh ...................... | H10K 59/121 |
| 2021/0020733 A1* | 1/2021 | Saida ..................... | H05B 33/22 |
| 2021/0126224 A1* | 4/2021 | Lee ...................... | H10K 77/111 |
| 2021/0391397 A1 | 12/2021 | Koo et al. | |
| 2021/0408469 A1 | 12/2021 | Ye | |

FOREIGN PATENT DOCUMENTS

| | | |
|---|---|---|
| CN | 108074959 A | 5/2018 |
| CN | 208298874 U | 12/2018 |
| CN | 111276630 A | 6/2020 |
| KR | 10-2017-0015829 A | 2/2017 |
| KR | 10-2018-0025053 A | 3/2018 |
| KR | 10-2018-0054385 A | 5/2018 |
| KR | 10-2019-0081061 A | 7/2019 |
| KR | 10-2021-0155674 A | 12/2021 |

* cited by examiner

*Primary Examiner* — Shaun M Campbell

(74) *Attorney, Agent, or Firm* — Birch, Stewart, Kolasch & Birch, LLP

(57) ABSTRACT

An electroluminescent display device according to an embodiment of the present disclosure can include a substrate including a display area and a non-display area, a planarization layer disposed on an upper portion of the substrate, a bank disposed on the planarization layer, a stopper disposed on the bank in the non-display area, at least one trench pattern disposed outside the stopper and configured by removing a partial region of the bank such that the planarization layer is exposed, and a sealing layer disposed above the substrate. As a result, an overflow of an organic material layer is suppressed, such that a dam in the related art can be eliminated, and a bezel width can be reduced.

15 Claims, 16 Drawing Sheets

AA　　NA　　DAM1　　DAM2

| ITEM | | UNIT | VALUE |
|---|---|---|---|
| PROCESS CONDITION | DROPPING HEIGHT | um | 500 |
| | DROPPING PITCH (x) | um | 40 |
| | DROPPING PITCH (z) | um | 31.75 |
| | DROPPING POSITION (x) | um | 83 |
| | DROPPING DISCHARGE AMOUNT | pL | 12 |
| | DROPPING SPEED | mm/sec | 500 |

FIG. 10A

| ITEM | | UNIT | VALUE |
|---|---|---|---|
| INK | DENSITY | g/mL | 1.118 |
| | VISCOSITY | mPa.s | 10.3(@40℃) |
| | SURFACE TENSION | mN/m | 24.8(@40℃) |
| | CONTACT ANGLE WITH SUBSTRATE | deg | 7.1 |

FIG. 10B

ELECTROLUMINESCENT DISPLAY DEVICE

CROSS-REFERENCE TO RELATED APPLICATIONS

This application claims priority to Korean Patent Application No. 10-2021-0178550 filed on Dec. 14, 2021 in the Republic of Korea, the entire contents of which are expressly incorporated by reference into the present application.

BACKGROUND

Field

The present disclosure relates to an electroluminescent display device, and more particularly, to an electroluminescent display device having a narrow bezel.

Description of the Related Art

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

As the representative display devices, there are a liquid crystal display device (LCD), an electrowetting display device (EWD), an organic light-emitting display device (OLED), and the like.

Among the display devices, an electroluminescent display device including the organic light-emitting display device refers to a display device that autonomously emits light. Unlike a liquid crystal display device, the electroluminescent display device does not require a separate light source and thus can be manufactured as a lightweight, thin display device.

In addition, the electroluminescent display device can be advantageous in terms of power consumption because the electroluminescent display device operates at a low voltage. Further, the electroluminescent display device is expected to be adopted in various fields because the electroluminescent display device is also excellent in implementation of colors, response speeds, viewing angles, and contrast ratios (CRs).

The electroluminescent display device is configured so that a light-emitting layer made of an organic material is disposed between two electrodes called an anode and a cathode. Further, when positive holes are injected into the light-emitting layer from the anode and electrons are injected into the light-emitting layer from the cathode, the injected electrons and positive holes are recombined and produce excitons in a light-emitting layer.

SUMMARY OF THE DISCLOSURE

An object to be achieved by the present disclosure is to provide an electroluminescent display device capable of having a bezel width reduced by removing a dam.

Another object to be achieved by the present disclosure is to provide an electroluminescent display device capable of having improved reliability.

Objects of the present disclosure are not limited to the above-mentioned objects, and other objects, which are not mentioned above, can be clearly understood by those skilled in the art from the following descriptions.

According to an aspect of the present disclosure, an electroluminescent display device includes a substrate including a display area and a non-display area, a planarization layer disposed on an upper portion of the substrate, a bank disposed on the planarization layer, a stopper disposed on the bank in the non-display area, at least one trench pattern disposed outside the stopper and configured by removing a partial region of the bank so that the planarization layer is exposed and a sealing layer disposed above the substrate.

According to another aspect of the present disclosure, an electroluminescent display device includes a substrate including a display area and a non-display area, a planarization layer disposed on an upper portion of the substrate, a bank disposed on the planarization layer, an undercut provided in the bank in the non-display area, a stopper configured (or defined) by the bank and disposed outside the undercut, at least one trench pattern disposed outside the stopper and configured by removing a partial region of the bank and a sealing layer disposed above the substrate.

Other detailed matters of the exemplary embodiments are included in the detailed description and the drawings.

According to the present disclosure, the stopper and the trench structure can be formed at the outer periphery of the display area or the undercut structure can be formed in the bank at the outer periphery of the non-display area, which makes it possible to suppress an overflow of the organic material layer and eliminate a dam in the related art. Therefore, it is possible to reduce the bezel width.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 10A and 10B are tables showing process conditions applied to simulations illustrated in FIGS. 9A and 9B;

DETAILED DESCRIPTION OF THE EMBODIMENTS

Figure 1:
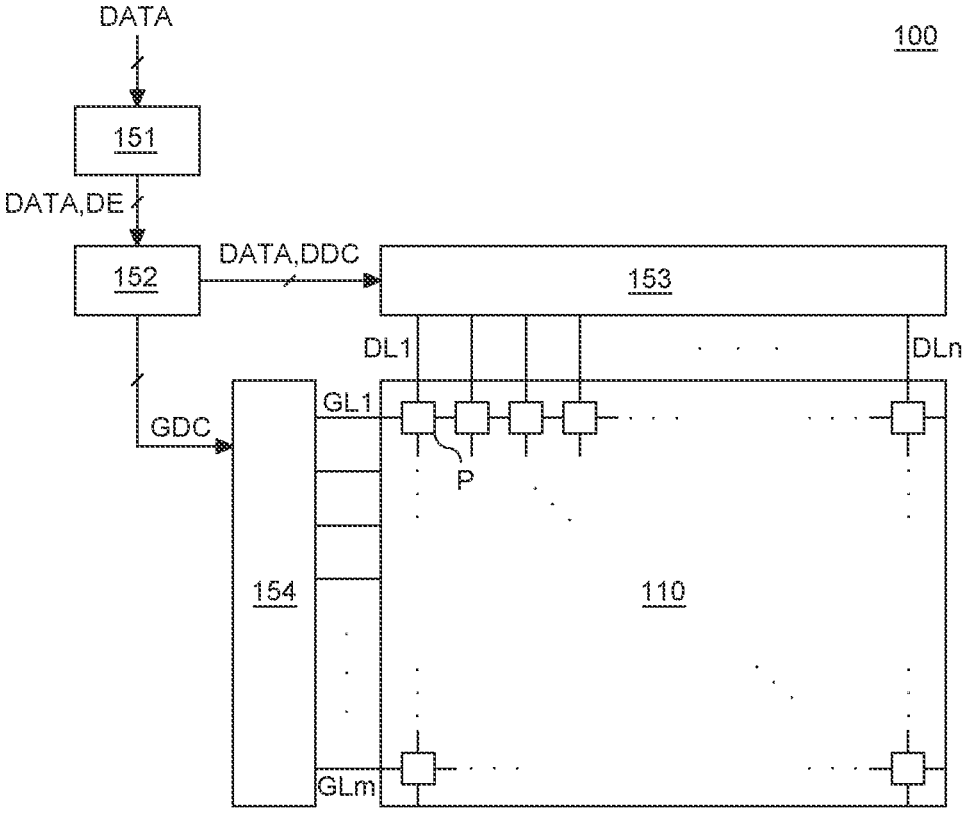
FIG. 1 is a block diagram of an electroluminescent display device according to a first embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define any order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings. Further, all the components of each electroluminescent display device according to all embodiments of the present disclosure are operatively coupled and configured.

FIG. 1 is a block diagram of an electroluminescent display device according to a first embodiment of the present disclosure.

Referring to FIG. 1, an electroluminescent display device 100 according to the first embodiment of the present disclosure can include an image processor 151, a timing controller 152, a data driver 153, a gate driver 154, and a display panel 110.

The image processor 151 can output a data signal DATA, a data enable signal DE, and the like in response to the data signal DATA supplied from the outside.

The image processor 151 can output one or more of a vertical synchronizing signal, a horizontal synchronizing signal, and a clock signal in addition to the data enable signal DE.

The timing controller 152 receives the data signal DATA in addition to the data enable signal DE or the driving signals including the vertical synchronizing signal, the horizontal synchronizing signal, and the clock signal from the image processor 151. Based on the driving signal, the timing controller 152 can output a gate timing control signal GDC for controlling an operation timing of the gate driver 154 and output a data timing control signal DDC for controlling an operation timing of the data driver 153.

In response to the data timing control signal DDC supplied from the timing controller 152, the data driver 153 can sample and latch the data signal DATA supplied from the timing controller 152, convert the data signal DATA into a gamma reference voltage, and output the gamma reference voltage. The data driver 153 can output the data signal DATA through a data line DL1-DLn where n is a natural number such as a positive integer.

The gate driver 154 can output the gate signal while shifting a level of the gate voltage in response to the gate timing control signal GDC supplied from the timing controller 152. The gate driver 154 can output the gate signal through a gate line GL1-GLm where m is a natural number such as a positive integer.

The display panel 110 can display an image as subpixels P emit light in response to the data signal DATA and the gate signal supplied from the data driver 153 and the gate driver 154. A detailed structure of the subpixel P will be described in detail with reference to FIGS. 2 and 5.

Figure 2:
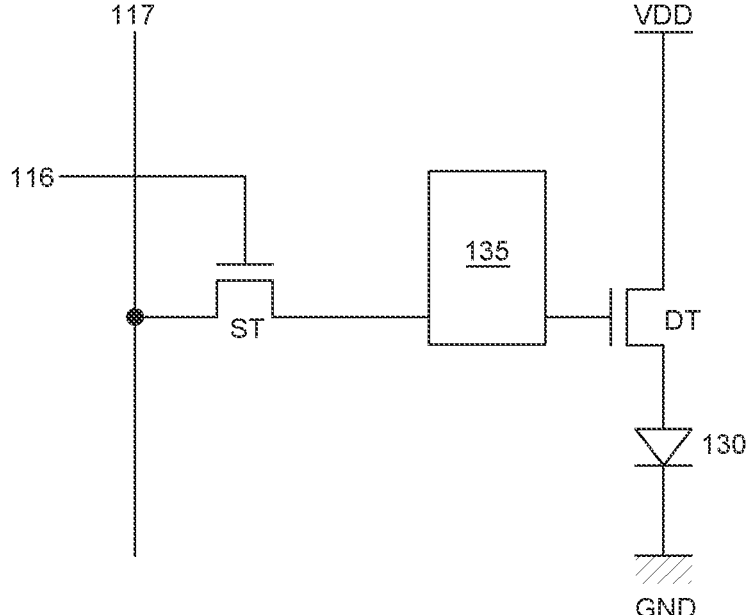
FIG. 2 is a circuit diagram of a subpixel of the electroluminescent display device according to the first embodiment of the present disclosure.

FIG. 2 is a circuit diagram of a subpixel of the electroluminescent display device according to the first embodiment of the present disclosure.

Referring to FIG. 2, the subpixel of the electroluminescent display device 100 according to the first embodiment of the present disclosure can include a switching transistor ST, a driving transistor DT, a compensating circuit 135, and a light-emitting element 130.

The light-emitting element 130 can operate to emit light based on a drive current produced by the driving transistor DT.

The switching transistor ST can perform a switching operation so that the data signal supplied through a data line 117 is stored, as a data voltage, in a capacitor in response to the gate signal supplied through a gate line 116.

The driving transistor DT can operate so that a predetermined drive current flows between a high-potential power line VDD and a low-potential power line GND while corresponding to data voltage stored in the capacitor.

The compensating circuit 135 is a circuit for compensating for a threshold voltage or the like of the driving transistor DT. The compensating circuit 135 can include one or more thin-film transistors and one or more capacitors. The compensating circuit 135 can have very various configurations depending on a compensation method.

An example is be described in which the subpixel illustrated in FIG. 2 has a 2T(Transistor)1C(Capacitor) structure including the switching transistor ST, the driving transistor DT, the capacitor, and the light-emitting element 130. However, when the compensating circuit 135 is added, the subpixel can have various configurations such as 3T1C, 4T2C, 5T2C, 6T1C, 6T2C, 7T1C, 7T2C, or the like.

Figure 3:
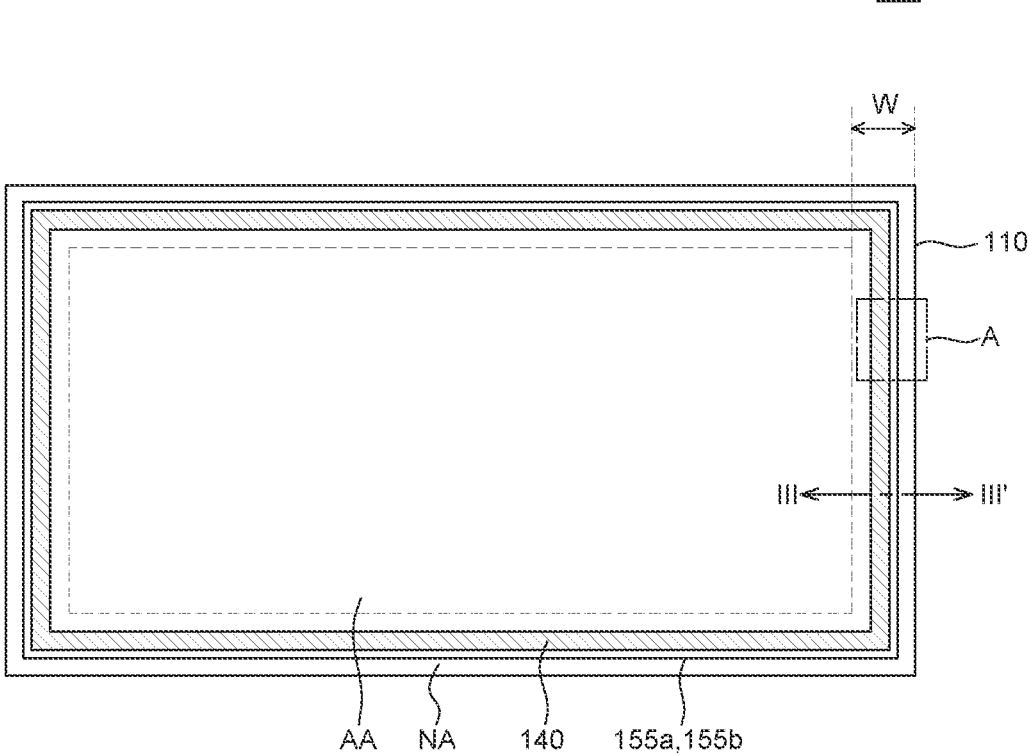
FIG. 3 is a top plan view of the electroluminescent display device according to the first embodiment of the present disclosure.

FIG. 3 is a top plan view of the electroluminescent display device according to the first embodiment of the present disclosure.

Figure 4:
FIG. 4 is a top plan view of an electroluminescent display device according to a comparative example.
Figure 4:
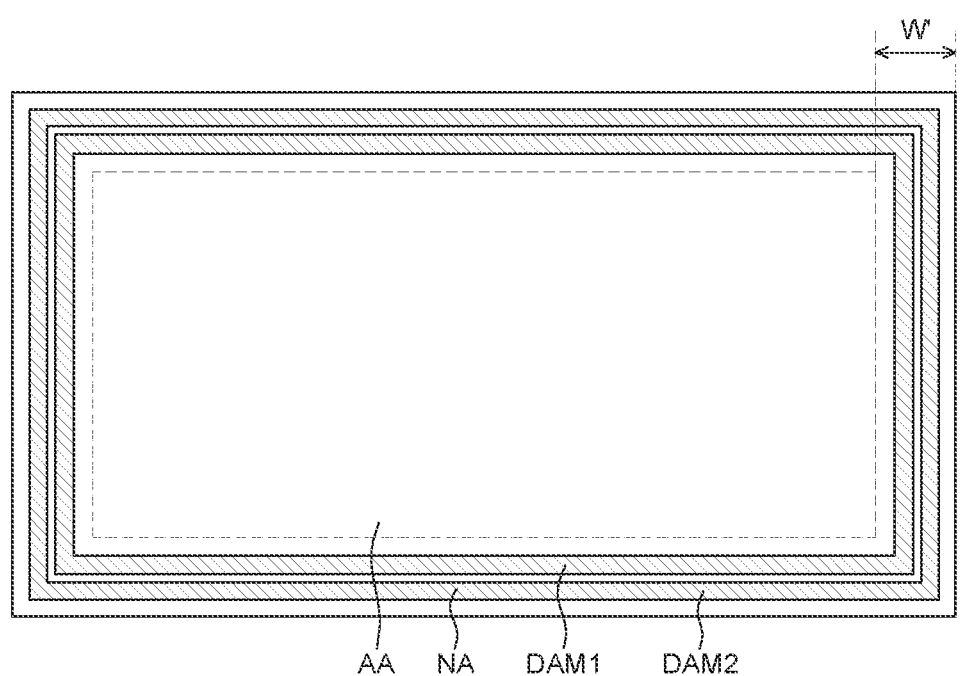

FIG. 4 is a top plan view of an electroluminescent display device according to a comparative example.

Figure 5:
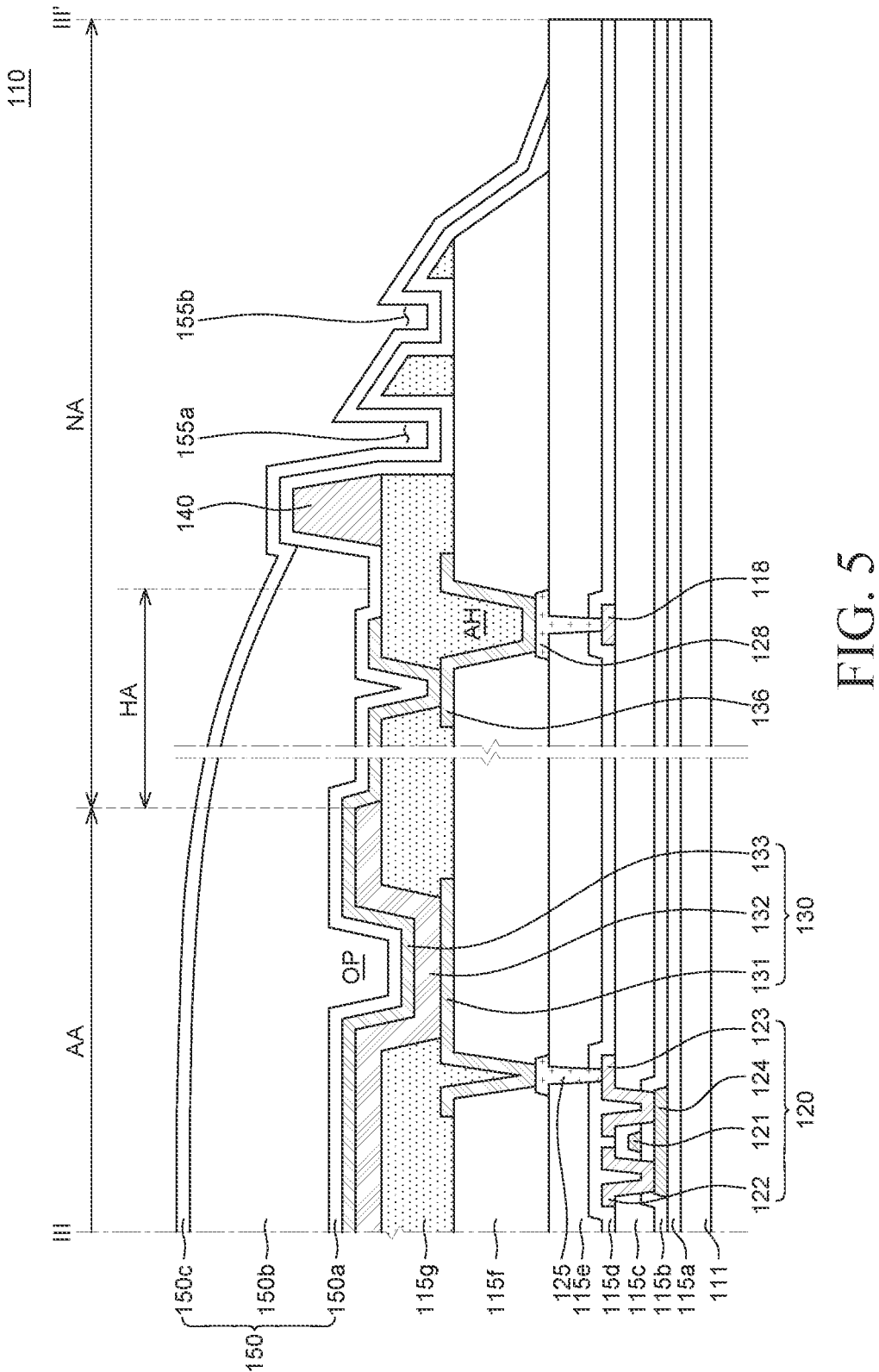
FIG. 5 is a cross-sectional view taken along line in FIG. 3.

FIG. 5 is a cross-sectional view taken along line in FIG. 3.

Figure 6:
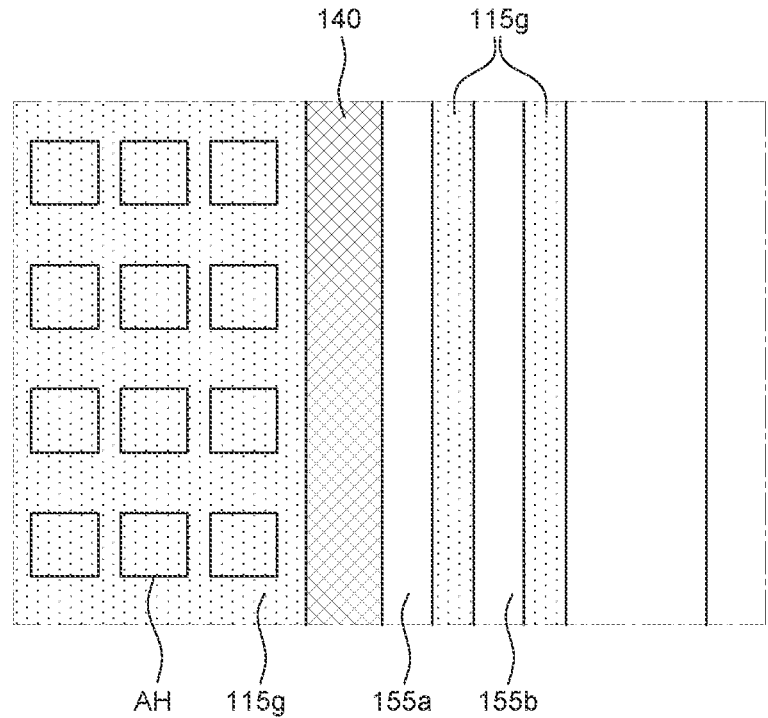
FIG. 6 is an enlarged view schematically illustrating part A in FIG. 3.

FIG. 6 is an enlarged view schematically illustrating part A in FIG. 3.

Referring to FIG. 3, the electroluminescent display device 100 according to the first embodiment of the present disclosure can include the display panel 110, a flexible film, and a printed circuit board.

The display panel 110 is a panel configured to display images to a user.

The display panel 110 can include a display element configured to display images, a driving element configured to operate the display element, and lines configured to transmit various types of signals to the display element and the driving element. Different display elements can be defined depending on the types of display panels 110. For example, in a case in which the display panel 110 is an organic light-emitting display panel, the display element can be an organic light-emitting element including an anode, an organic light-emitting layer, and a cathode.

Hereinafter, the assumption is made that the display panel 110 is the organic light-emitting display panel. However, the display panel 110 is not limited to the organic light-emitting display panel.

The display panel 110 can include a display area AA and a non-display area NA. The display area AA is an area of the display panel 110 in which images are displayed.

The display area AA can include a plurality of subpixels constituting the plurality of pixels, and a circuit configured to operate the plurality of subpixels. The plurality of subpixels is minimum units constituting the display area AA. The display element can be disposed in each of the plurality of subpixels. The plurality of subpixels can constitute the pixel. For example, the plurality of subpixels can each include the light-emitting element including the anode, a light-emitting part, and a cathode. However, the present disclosure is not limited thereto. In addition, the circuit configured to operate the plurality of subpixels can include driving elements, lines, and the like. For example, the circuit can include, but not limited to, a thin-film transistor, a storage capacitor, a gate line, a data line, and the like.

The non-display area NA is an area in which no image is displayed.

FIG. 3 illustrates that the non-display area NA surrounds the display area AA having a quadrangular shape. However, the shapes and arrangements of the display area AA and the non-display area NA are not limited to the example illustrated in FIG. 3.

The display area AA and the non-display area NA can be suitable for the design of an electronic device equipped with the electroluminescent display device 100. For example, an exemplary shape of the display area AA can be a pentagonal shape, a hexagonal shape, a circular shape, an elliptical shape, or the like.

Various lines and circuits for operating the organic light-emitting element in the display area AA can be disposed in the non-display area NA. For example, the non-display area NA can include, but not limited to, link lines for transmitting signals to the plurality of subpixels and the circuit in the display area AA. The non-display area NA can include a drive IC such as a gate driver IC and a data driver IC.

Meanwhile, the left and right sides in FIG. 3 can be defined as gate pad parts on which the gate driver IC is disposed. The lower side in FIG. 3 can be defined as a data pad part connected to the flexible film. However, the present disclosure is not limited thereto.

The electroluminescent display device can include various additional elements configured to create various signals or operate the pixels in the display area AA. The additional elements for operating the pixel can include an inverter circuit, a multiplexer, an electrostatic discharge (ESD) circuit, and the like. The electroluminescent display device can also include additional elements related to functions other than the function of operating the pixel. For example, the electroluminescent display device can include additional elements that provide a touch detection function, a user certification function (e.g., fingerprint recognition), a multi-level pressure detection function, a tactile feedback function, and the like. The additional elements can be positioned in the non-display area NA and/or an external circuit connected to a connection interface.

The flexible film is a film for supplying signals to the plurality of subpixels and the circuit in the display area AA. The flexible film can be electrically connected to the display panel 110. The flexible film is disposed at one end of the non-display area NA of the display panel 110. The flexible film can supply power voltage, data voltage, and the like to the plurality of subpixels and the circuit in the display area AA. For example, the drive IC such as the data driver IC can be disposed on the flexible film.

The printed circuit board can be disposed at one end of the flexible film and connected to the flexible film. The printed circuit board is a component configured to supply signals to the drive IC. The printed circuit board can supply the drive IC with various signals such as driving signals, data signals, and the like.

Meanwhile, in order to ensure reliability such as inhibition of penetration of moisture, the electroluminescent display device requires a minimum bezel distance. In addition, the non-display area NA of the display device, except for the display area AA for displaying images, needs to have a slim size to meet the requirement of the slim display device. However, referring to FIG. 4, an electroluminescent display device 10 according to a comparative example adopts a dual dam structure having a primary dam DAM1 and a secondary dam DAM2 in order to control a flow of the organic substance layer. Because of the primary dam DAM1 and the secondary dam DAM2, there can be a limitation in that a sufficient bezel distance needs to be ensured, and a bezel width W' increases. If the dams DAM1 and DAM2 are removed, the flow of the organic substance layer cannot be controlled, and the organic substance layer can overflow.

Therefore, referring back to FIG. 3, in the first embodiment of the present disclosure, a stopper 140 and trench patterns 155a and 155b are formed in the non-display area NA at an outer periphery of the display area AA in order to control the flow of the organic substance layer. Therefore, dams in the related art can be removed, and the bezel width W can be reduced. For example, a dam in the related art has a horizontal structure disposed at an outer periphery of a bank, but the stopper 140 according to the first embodiment of the present disclosure has a vertical structure disposed above a bank. Further, the trench patterns 155a and 155b each have a smaller width than the dam. Therefore, the bezel width W can be reduced in the first embodiment of the present disclosure.

As described above, in the first embodiment of the present disclosure, a structure for suppressing a flow of the organic substance layer, which includes the stopper 140 and the trench patterns 155a and 155b, is added to cope with the overflow of the organic substance layer that occurs when the dual dam structure in the related art is changed to the dam-less structure.

The stopper 140 can be provided above the bank in an end tapered region of a planarization layer, and the trench patterns 155a and 155b can be formed by removing a part of the bank provided outside the stopper 140.

Referring to FIGS. 5 and 6, a substrate 111 can be divided into the display area AA and the non-display area NA provided at the outer periphery of the display area AA. The non-display area NA can include a hole area HA.

A plurality of anode holes AH can be formed in the hole area HA of the non-display area NA. The stopper 140 and the trench patterns 155a and 155b can be formed outside the hole area HA.

A thin-film transistor 120, the light-emitting element 130, and a sealing layer 150 can be formed in the display area AA of the substrate 111.

The substrate 111 serves to support and protect the components of the electroluminescent display device that are disposed on an upper portion of the substrate 111.

Recently, the flexible substrate 111 can be made of a flexible material such as plastic having flexibility.

The flexible substrate 111 can be provided in the form of a film made of one selected from a group consisting of polyester-based polymer, silicon-based polymer, acrylic polymer, polyolefin-based polymer, and a copolymer thereof.

The buffer layer 115a can be disposed on the flexible substrate 111. The buffer layer 115a can suppress the penetration of outside moisture or other impurities into the flexible substrate 111 and flatten a surface of the flexible substrate 111. The buffer layer 115a is not a necessarily essential component and can be eliminated depending on the type of the thin-film transistor 120.

The thin-film transistor 120 can be disposed on the upper portion of the flexible substrate 111 and include a gate electrode 121, a source electrode 122, a drain electrode 123, and a semiconductor layer 124.

In this case, the semiconductor layer 124 can be made of amorphous silicon or polycrystalline silicon. However, the present disclosure is not limited thereto. The polycrystalline silicon has better mobility and reliability and requires lower energy power consumption than the amorphous silicon. Therefore, the polycrystalline silicon can be applied to the driving thin-film transistor in the pixel.

The semiconductor layer 124 can be made of an oxide semiconductor. The oxide semiconductor is excellent in mobility and uniformity properties. The oxide semiconductor can be made of materials based on indium-tin-gallium-zinc oxide (InSnGaZnO) which is quaternary metal oxide, materials based on indium-gallium-zinc oxide (InGaZnO), indium-tin-zinc oxide (InSnZnO), indium-aluminum-zinc oxide (InAlZnO), tin-gallium-zinc oxide (SnGaZnO), aluminum-gallium-zinc oxide (AlGaZnO), and tin-aluminum-zinc oxide (SnAlZnO) which are ternary metal oxide, materials based on indium-zinc oxide (InZnO), tin-zinc oxide (SnZnO), aluminum-zinc oxide (AlZnO), zinc-magnesium oxide (ZnMgO), tin-magnesium oxide (SnMgO), indium-magnesium oxide (InMgO), and indium-gallium oxide (InGaO) which are binary metal oxide, and materials based on indium oxide (InO), tin oxide (SnO), and zinc oxide (ZnO). The present disclosure is not limited to a composition ratio of the respective elements.

The semiconductor layer 124 can include source and drain regions including p-type or n-type impurities and a channel region between the source region and the drain region. The semiconductor layer 124 can further include a low-concentration doping region between the source and drain regions adjacent to the channel region.

The source and drain regions are regions in which impurities are doped at high concentration. The source electrode 122 and the drain electrode 123 of the thin-film transistor 120 can be respectively connected to the source and drain regions.

The p-type impurities or n-type impurities can be used as impurities ions. The p-type impurity can be one of boron (B), aluminum (Al), gallium (Ga), and indium (In). The n-type impurity can be one of phosphorus (P), arsenic (As), and antimony (Sb).

The channel region can be doped with the n-type impurities or p-type impurities depending on the structures of the thin-film transistors of NMOS or PMOS.

A first insulating layer 115b is a gate insulating layer configured as a single layer or multilayer made of silicon oxide (SiOx) and silicon nitride (SiNx). The first insulating layer 115b can be disposed on the semiconductor layer 124 so that the current flowing through the semiconductor layer 124 does not flow to the gate electrode 121. The silicon oxide has lower flexibility than metal but has higher flexibility than silicon nitride. A single layer or multilayer made of silicon oxide can be implemented in accordance with the properties of the silicon oxide.

The gate electrode 121 can serve as a switch configured to turn on or off the thin-film transistor 120 based on an electrical signal transmitted from the outside through the gate line. The gate electrode 121 can be configured as a single layer or multilayer made of a conductive metallic material such as copper (Cu), aluminum (Al), molybdenum (Mo), chromium (Cr), gold (Au), titanium (Ti), nickel (Ni), neodymium (Nd), or an alloy thereof. However, the present disclosure is not limited thereto.

The source electrode 122 and the drain electrode 123 can be connected to the data line and allow the electrical signal transmitted from the outside to be transmitted from the thin-film transistor 120 to the light-emitting element 130. In this case, the source electrode 122 and the drain electrode 123 can each be configured as a single layer or multilayer made of a conductive metallic material such as copper (Cu), aluminum (Al), molybdenum (Mo), chromium (Cr), gold (Au), titanium (Ti), nickel (Ni), neodymium (Nd), or an alloy thereof. However, the present disclosure is not limited thereto.

In this case, a second insulating layer 115c configured as a single layer or multilayer made of silicon oxide (SiOx) or silicon nitride (SiNx) can be disposed between the gate electrode 121, the source electrode 122, and the drain electrode 123 in order to insulate the gate electrode 121, the source electrode 122, and the drain electrode 123 from one another.

Meanwhile, a first low-potential power line 118 can be disposed on the second insulating layer 115*c* in the non-display area NA and apply a low-potential voltage to a cathode 133.

A protective layer 115*d* can be disposed on the thin-film transistor 120 and the first low-potential power line 118. The protective layer 115*d* can be configured as an inorganic insulating layer made of silicon oxide (SiOx) and silicon nitride (SiNx).

The protective layer 115*d* can serve to suppress unnecessary electrical connection between the components disposed above and below the protective layer 115*d*. The protective layer 115*d* can also serve to inhibit damage or contamination from the outside. The protective layer 115*d* can be eliminated in accordance with the configurations and properties of the thin-film transistor 120 and the light-emitting element 130.

The thin-film transistor 120 can be classified into an inverted staggered structure and a coplanar structure depending on the positions of the components constituting the thin-film transistor 120. For example, in the case of the thin-film transistor having the inverted staggered structure, the gate electrode can be positioned at a side opposite to the source electrode and the drain electrode based on the semiconductor layer. As illustrated in FIG. 5, in the case of the thin-film transistor 120 having the coplanar structure, the gate electrode can be positioned at the same side as the source electrode 122 and the drain electrode 123 based on the semiconductor layer 124.

FIG. 5 illustrates the thin-film transistor 120 having the coplanar structure, as an example. However, the electroluminescent display device according to the first embodiment of the present disclosure can also include the thin-film transistor having the inverted staggered structure.

For the convenience of description, only the driving thin-film transistor 120 is illustrated among various thin-film transistors that can be included in the electroluminescent display device. However, a switching thin-film transistor, a capacitor, and the like can also be included in the electroluminescent display device.

When a signal is applied from the gate line, the switching thin-film transistor can transmit the signal from the data line to the gate electrode 121 of the driving thin-film transistor 120. In response to a signal received from the switching thin-film transistor, the driving thin-film transistor 120 can transmit the current, which is transmitted through the power line, to an anode 131. The driving thin-film transistor 120 can control light emission on the basis of the current transmitted to the anode 131.

Planarization layers 115*e* and 115*f* can be disposed on the thin-film transistor 120 to protect the thin-film transistor 120, reduce a level difference caused by the thin-film transistor 120, and reduce parasitic capacitance occurring between the thin-film transistor 120, the gate line, the data line, and the light-emitting element 130.

The planarization layers 115*e* and 115*f* can each made of one or more materials among acrylic resin, epoxy resin, phenolic resin, polyimide-based, unsaturated polyester-based resin, polyamide-based resin, benzocyclobutene, polyphenylene-based resin, and polyphenylene sulfide-based resin. However, the present disclosure is not limited thereto.

The electroluminescent display device according to the first embodiment of the present disclosure can include a first planarization layer 115*e* and a second planarization layer 115*f* sequentially stacked. In this case, the first planarization layer 115*e* can be disposed on the thin-film transistor 120, and the second planarization layer 115*f* can be disposed on the first planarization layer 115*e*.

A buffer layer can be further disposed on the first planarization layer 115*e*. The buffer layer can be configured as a multilayer made of silicon oxide (SiOx) in order to protect the components disposed on the first planarization layer 115*e*. The buffer layer can be eliminated in accordance with the configurations and properties of the thin-film transistor 120 and the light-emitting element 130.

An intermediate electrode 125 can be connected to the thin-film transistor 120 through a first contact hole formed in the first planarization layer 115*e* and the protective layer 115*d*. The intermediate electrode 125 is stacked to be connected to the thin-film transistor 120, so that the data line can have a multilayer structure.

The data line can have a structure in which a lower layer made of the same material as the source electrode 122 and the drain electrode 123 is connected to an upper layer made of the same material as the intermediate electrode 125. For example, the data line can be implemented as a data line having a structure in which two layers are connected to each other in parallel. In this case, line resistance of the data line can be reduced. However, the present disclosure is not limited thereto.

Meanwhile, a second contact hole can be formed in the first planarization layer 115*e* and the protective layer 115*d* in the non-display area NA, and a part of the first low-potential power line 118 can be exposed through the second contact hole. A second low-potential power line 128 can be electrically connected to the first low-potential power line 118 through the second contact hole.

The first planarization layer 115*e* and the insulating layer disposed below the first planarization layer 115*e* can be disposed to extend to an end of the substrate 111 in the non-display area NA. However, the present disclosure is not limited thereto.

A protective layer can be further disposed on the first planarization layer 115*e*, the intermediate electrode 125, and the second low-potential power line 128. The protective layer can serve to suppress unnecessary electrical connection between the components. The protective layer can also serve to inhibit damage or contamination from the outside. The protective layer can be eliminated in accordance with the configurations and properties of the thin-film transistor 120 and the light-emitting element 130.

The second planarization layer 115*f* can be disposed on the first planarization layer 115*e*.

The second planarization layer 115*f* in the non-display area NA can include the plurality of anode holes AH through which a part of the second low-potential power line 128 is exposed. In this case, the plurality of anode holes AH can be disposed in the hole area HA in the non-display area NA adjacent to the display area AA.

The plurality of anode holes AH can be disposed along four edges around the display area AA. However, the present disclosure is not limited thereto.

The anode hole AH can be used as a passageway for discharging out gas produced from the planarization layers 115*e* and 115*f* during a process of baking a bank 115*g*.

The second planarization layer 115*f* can be disposed to extend to a part of the non-display area NA, so that a part of the first planarization layer 115e can be exposed. However, the present disclosure is not limited thereto.

A side surface of the second planarization layer 115f extending to a part of the non-display area NA can be inclined. However, the present disclosure is not limited thereto.

The light-emitting element 130 including the anode 131, a light-emitting part 132, and the cathode 133 can be disposed on the second planarization layer 115f.

The anode 131 can be disposed on the second planarization layer 115f.

The anode 131 is an electrode that serves to supply positive holes to the light-emitting part 132. The anode 131 can be electrically connected to the intermediate electrode 125 through a contact hole formed in the second planarization layer 115f, so that the anode 131 can be connected to the thin-film transistor 120.

The anode 131 can be made of a transparent, electrically conductive material such as indium tin oxide (ITO) and indium zinc oxide (IZO). However, the present disclosure is not limited thereto.

In the case of the top emission type electroluminescent display device that emits light toward an upper side at which the cathode 133 is disposed, the anode 131 can further include a reflective layer so that the emitted light can be reflected by the anode 131 and more smoothly discharged to the upper side at which the cathode 133 is disposed.

For example, the anode 131 can have a two-layer structure in which a reflective layer and a transparent conductive layer made of a transparent electrically conductive material are sequentially stacked. Alternatively, the anode 131 can have a three-layer structure in which the transparent conductive layer, the reflective layer, and the transparent conductive layer are sequentially stacked. The reflective layer can be made of an alloy containing silver (Ag).

A connection electrode 136 can be disposed on the second planarization layer 115f in the non-display area NA and electrically connected to the second low-potential power line 128 through the anode hole AH.

The bank 115g can be disposed on the anode 131, the second low-potential power line 128, and the second planarization layer 115f.

The bank 115g disposed on the anode 131 and the second planarization layer 115f can define the subpixel by dividing the area in which light is actually emitted. The bank 115g can be formed by performing photolithography after forming a photoresist on the anode 131. The photoresist refers to photosensitive resin having solubility that is changed in respect to a developer by the action of light. A particular pattern can be obtained by exposing and developing the photoresist. The photoresists can be classified into a positive photoresist and a negative photoresist. The positive photoresist refers to a photoresist in which solubility of an exposed part in respect to a developer is increased by exposure. When the positive photoresist is developed, a pattern from which the exposed part is removed is obtained. The negative photoresist refers to a photoresist in which solubility of an exposed part in respect to a developer is decreased by exposure. When the negative photoresist is developed, a pattern from which a non-exposed part is removed is obtained.

A fine metal mask (FMM), which is a deposition mask, can be used to form the light-emitting part 132 of the light-emitting element 130.

In addition, a spacer can be disposed above the bank 115g and made of one of polyimide, photo acrylic, and benzocyclobutene which are transparent organic materials. The spacer is used to inhibit damage caused by contact with the deposition mask disposed on the bank 115g. The spacer serves to maintain a predetermined distance between the bank 115g and the deposition mask.

The bank 115g can have an opening portion OP formed by removing a part of the bank 115g in the light-emitting area. A part of the anode 131 can be exposed through the opening portion OP.

In addition, the bank 115g can include a third contact hole formed by removing a part of the bank 115g in the hole area HA in the non-display area NA. A part of the connection electrode 136 can be exposed through the third contact hole.

The bank 115g can be disposed to extend to a part of the non-display area NA and inclined along the inclined side surface of the second planarization layer 115f However, the present disclosure is not limited thereto.

Meanwhile, the plurality of trench patterns 155a and 155b can be formed by removing a part of the bank 115g adjacent to the inclined side surface of the bank 115g, so that the second planarization layer 115f can be exposed.

The plurality of trench patterns 155a and 155b can be positioned outside the anode hole AH.

The plurality of trench patterns 155a and 155b can include a first trench pattern 155a positioned at a relatively inner side, and a second trench pattern 155b positioned at a relatively outer side.

The first trench pattern 155a can have a larger depth than the second trench pattern 155b.

The first trench pattern 155a and the second trench pattern 155b can each be provided in the form of a quadrangular frame that surrounds the display area AA.

The first trench pattern 155a can have a depth of about 1.5 μm and a width of about 1.0 μm. The second trench pattern 155b can have a depth of about 1.0 μm and a width of about 1.0 μm. However, the present disclosure is not limited thereto.

Meanwhile, the stopper 140 can be disposed on the bank 115g in the non-display area NA.

The stopper 140 can be formed by the same process as the spacer. However, the present disclosure is not limited thereto.

The stopper 140 can be provided between the anode hole AH and the first trench pattern 155a and disposed on the bank 115g.

The stopper 140 can be provided in the form of a quadrangular frame that surrounds the display area AA.

FIG. 5 illustrates the single stopper 140, but the present disclosure is not limited thereto. A plurality of stoppers 140 can be provided.

FIG. 5 illustrates the stopper 140 having a regular tapered shape, but the present disclosure is not limited thereto. The stopper 140 can have an inverted tapered shape.

The stopper 140 can have a height that can control a flow of an organic material layer 150b.

The light-emitting part 132 can be disposed between the anode 131 and the cathode 133.

The light-emitting part 132 serves to emit light. The light-emitting part 132 can include at least one of a hole injection layer (HIL), a hole transport layer (HTL), a light-emitting layer, an electron transport layer (ETL), and an electron injection layer (EIL). Some components can be eliminated depending on the structure or properties of the electroluminescent display device. In this case, an electroluminescent layer and an inorganic light-emitting layer can be applied as the light-emitting layer.

The hole injection layer is disposed on the anode 131 and serves to facilitate the injection of the positive holes.

The hole transport layer is disposed on the hole injection layer and serves to smoothly transmit the positive holes to the light-emitting layer.

The light-emitting layer is disposed on the hole transport layer. The light-emitting layer can be made of a material capable of emitting light with a particular color, thereby emitting the light with the particular color. Further, a phosphorescent material or a fluorescent material can be used as the light-emitting material.

The electron injection layer can further be disposed on the electron transport layer. The electron injection layer is an organic layer that facilitates the injection of electrons from the cathode 133. The electron injection layer can be eliminated depending on the structure and properties of the electroluminescent display device.

Meanwhile, an electron blocking layer for blocking a flow of electrons or a hole blocking layer for blocking a flow of positive holes is further disposed at a position adjacent to the light-emitting layer. Therefore, it is possible to inhibit the electron from moving from the light-emitting layer and passing through the adjacent hole transport layer when the electrons are injected into the light-emitting layer or inhibit the positive hole from moving from the light-emitting layer and passing through the adjacent electron transport layer when the positive holes are injected into the light-emitting layer, thereby improving luminous efficiency.

The light-emitting part 132 can be disposed to extend to a boundary between the display area AA and the non-display area NA. However, the present disclosure is not limited thereto.

The cathode 133 is disposed on the light-emitting part 132 and serves to supply the electrons to the light-emitting part 132. The cathode 133 needs to supply electrons. Therefore, the cathode 133 can be made of a metallic material such as magnesium, a silver-magnesium alloy, or the like that is an electrically conductive material having a low work function. However, the present disclosure is not limited thereto.

In the case of the top-emission electroluminescent display device, the cathode 133 can be made of transparent conductive oxide such as indium tin oxide (ITO), indium zinc oxide (IZO), indium-tin-zinc oxide (ITZO), zinc oxide (ZnO), and tin oxide (TO).

The cathode 133 can be disposed to extend to a part of the non-display area NA so as to cover the light-emitting part 132. However, the present disclosure is not limited thereto.

The cathode 133 extending to a part of the non-display area NA can be electrically connected to the connection electrode 136 through the third contact hole. Therefore, the cathode 133 can receive the low-potential voltage through the first and second low-potential power lines 118 and 128.

Meanwhile, a sealing layer 150 can be disposed on the light-emitting element 130 and inhibit the light-emitting element 130 and the thin-film transistor 120, which are the constituent elements of the electroluminescent display device, from being oxidized or damaged by moisture, oxygen, or impurities introduced from the outside.

The sealing layer 150 can include a plurality of layers including a first inorganic material layer 150a, a second inorganic material layer 150c, and the organic material layer 150b.

The first inorganic material layer 150a can be disposed on an entire surface of upper portions of the thin-film transistor 120 and the light-emitting element 130. The first inorganic material layer 150a can completely cover the light-emitting element 130 to seal the light-emitting element 130. Therefore, the first inorganic material layer 150a can be called a first sealing layer. The first inorganic material layer 150a can be made of one of silicon nitride (SiNx) and aluminum oxide (AlyOz) that are inorganic insulating materials. However, the present disclosure is not limited thereto.

The first inorganic material layer 150a can be disposed to extend to a part of the non-display area NA.

The first inorganic material layer 150a can be disposed to cover a top surface and a side surface of the stopper 140 and cover inner surfaces of the first trench pattern 155a and the second trench pattern 155b.

The first inorganic material layer 150a can be disposed to cover the inclined side surface of the bank 115g and the side surface of the second planarization layer 115f.

Therefore, the first inorganic material layer 150a extending to a part of the non-display area NA can be inclined along the inclined side surface of the second planarization layer 115f. However, the present disclosure is not limited thereto.

The organic material layer 150b can be disposed on the first inorganic material layer 150a.

For example, fine particles can be introduced during a process of forming the first inorganic material layer 150a and the light-emitting element 130. Because of the fine particles, the step coverage of the first inorganic material layer 150a has a value less than 100%. The curved first inorganic material layer 150a can be flattened by applying an organic resin material onto the first inorganic material layer 150a in order to minimize cracks that can be caused by the fine particles. In this case, a thickness of the organic material layer 150b, which is the planarization layer, can be larger than a diameter of the fine particle managed in the corresponding process so that the organic material layer 150b can cover the fine particles introduced during the process of forming the light-emitting element 130 and the like.

If the organic material layer 150b is formed directly on the light-emitting element 130, gas, which is produced during a process of curing the organic material layer, can contract the pixel. Therefore, the organic material layer 150b can be formed after the light-emitting element 130 is protected by an inorganic material layer such as the first inorganic material layer 150a instead of being formed to be in contact with the light-emitting element 130.

The organic material layer 150b can be made of a polymer-based material and formed by vacuum screen printing (VSP), inkjet printing, metalorganic chemical vapor deposition (MOCVD), or the like.

The organic material layer 150b can be disposed to a position before the stopper 140. For example, the flow of the organic material layer 150b can be controlled by the stopper 140, thereby suppressing an overflow of the organic material layer 150b. If the organic material layer 150b flows over the stopper 140, the organic material layer 150b can be trapped in the first trench pattern 155a and the second trench pattern 155b, such that the organic material layer 150b may not overflow any further.

As described above, according to the present disclosure, the overflow of the organic material layer 150b can be suppressed, and a dam in the related art can be removed, so that the bezel width can be reduced.

The second inorganic material layer 150c can be disposed on the organic material layer 150b and the first inorganic material layer 150a.

In general, because the organic material layer 150b has low performance in delaying moisture penetration, the second inorganic material layer 150c is configured to cover the organic material layer 150b by bonding a rim of the second inorganic material layer 150c, which is disposed at the upper side to the first inorganic material layer 150a that is disposed at the lower side. For example, the second inorganic material layer 150c can completely cover the organic material layer 150b. Therefore, the second inorganic material layer 150c can be called a second sealing layer.

The second inorganic material layer 150c can be disposed to extend to a part of the non-display area NA, so that a part of the first planarization layer 115e can be exposed. However, the present disclosure is not limited thereto.

In this case, the second inorganic material layer 150c extending to a part of the non-display area NA can be inclined along the inclined side surface of the second planarization layer 115f. However, the present disclosure is not limited thereto.

Meanwhile, the trench pattern according to the present disclosure can include the bank and form a part of the thickness of the second planarization layer. This configuration will be described in detail with reference to FIGS. 7 and 8.

Figure 7:
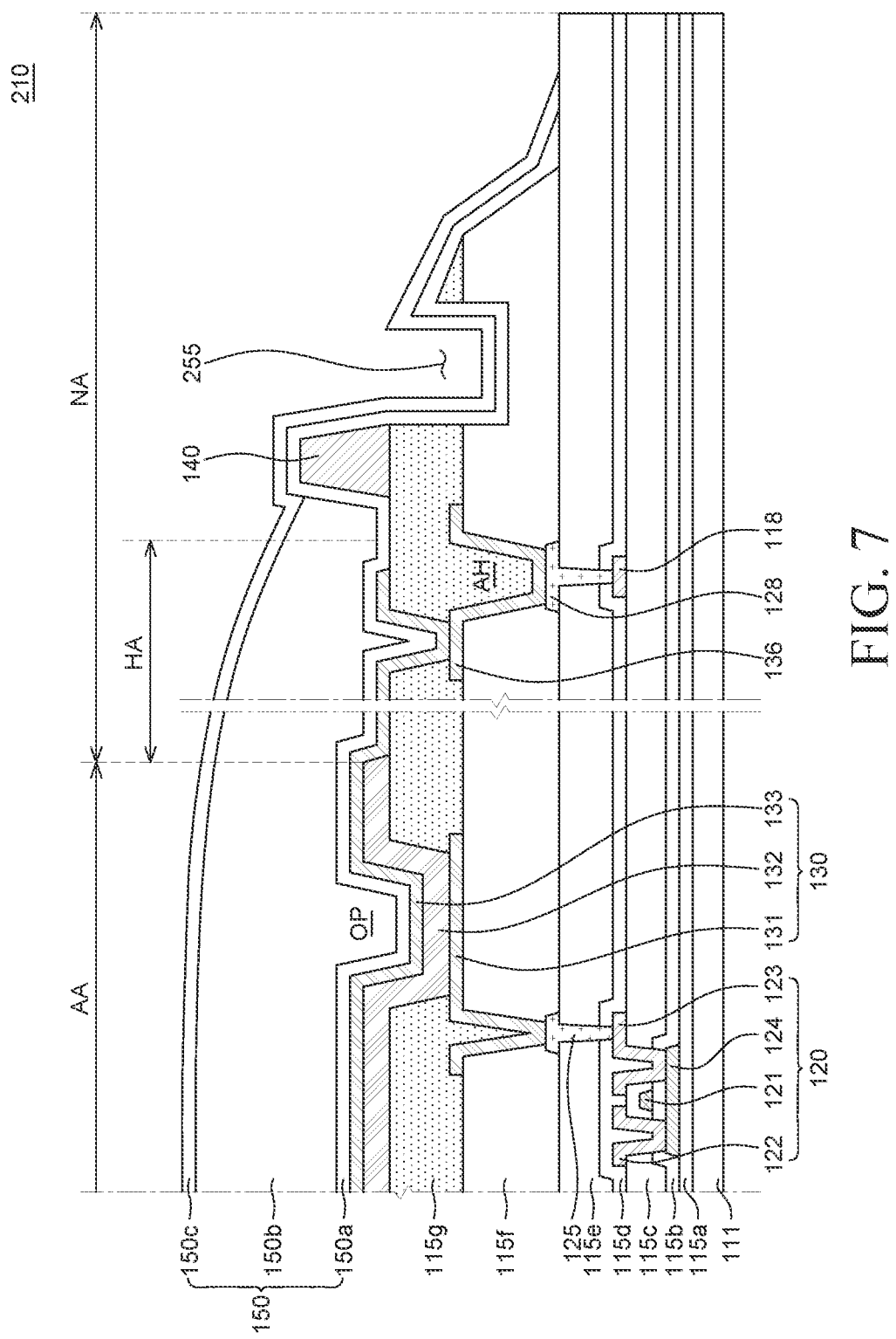
FIG. 7 is a cross-sectional view of a display panel according to a second embodiment of the present disclosure.

FIG. 7 is a cross-sectional view of a display panel according to a second embodiment of the present disclosure.

Figure 8:
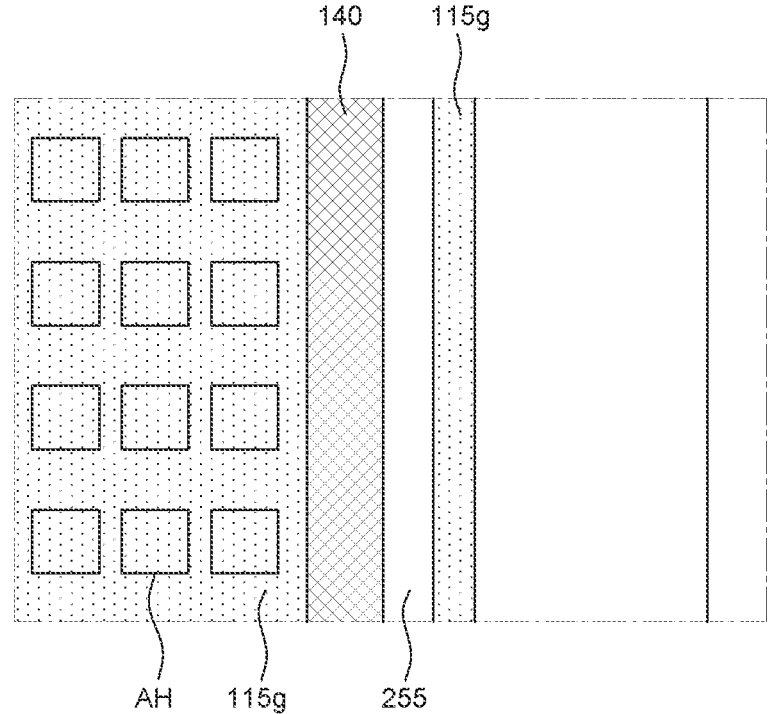
FIG. 8 is a top plan view schematically illustrating a part of FIG. 7.

FIG. 8 is a top plan view schematically illustrating a part of FIG. 7.

The second embodiment illustrated in FIGS. 7 and 8 is substantially identical in configuration to the first embodiment illustrated in FIGS. 5 and 6, except for a shape of a trench pattern 255. Therefore, repeated descriptions of the identical components will be omitted or may be briefly provided. The same reference numerals are used for the same components.

Referring to FIGS. 7 and 8, a display panel 210 according to the second embodiment of the present disclosure can include the display area AA and the non-display area NA.

In the second embodiment of the present disclosure, the stopper 140 and the trench pattern 255 are formed in the non-display area NA at the outer periphery of the display area AA in order to control the flow of the organic material layer. Therefore, a dam in the related art can be removed, and the bezel width can be reduced in the present disclosure.

The stopper 140 can be formed on the bank 115g in the end tapered region of the second planarization layer 115f. The trench pattern 255 can be formed by removing a part of a thickness of the second planarization layer 115f and removing a part of the bank 115g provided outside the stopper 140.

Referring to FIGS. 7 and 8, the substrate 111 can be divided into the display area AA and the non-display area NA provided at the outer periphery of the display area AA. The non-display area NA can include the hole area HA.

The plurality of anode holes AH can be formed in the hole area HA of the non-display area NA. The stopper 240 and the trench pattern 255 can be formed outside the hole area HA.

Like the first embodiment, the display panel 210 according to the second embodiment of the present disclosure can include the first planarization layer 115e and the second planarization layer 115f sequentially stacked.

The first planarization layer 115e and the insulating layer disposed below the first planarization layer 115e can be disposed to extend to the end of the substrate 111 in the non-display area NA. However, the present disclosure is not limited thereto.

The second planarization layer 115f in the non-display area NA can include the plurality of anode holes AH through which a part of the second low-potential power line 128 is exposed. In this case, the plurality of anode holes AH can be disposed in the hole area HA in the non-display area NA adjacent to the display area AA.

The plurality of anode holes AH can be disposed along the four edges around the display area AA. However, the present disclosure is not limited thereto.

The second planarization layer 115f can be disposed to extend to a part of the non-display area NA, so that a part of the first planarization layer 115e can be exposed. However, the present disclosure is not limited thereto.

The side surface of the second planarization layer 115f extending to a part of the non-display area NA can be inclined. However, the present disclosure is not limited thereto.

The light-emitting element 130 including the anode 131, the light-emitting part 132, and the cathode 133 can be disposed on the second planarization layer 115f.

The connection electrode 136 can be disposed on the second planarization layer 115f in the non-display area NA and electrically connected to the second low-potential power line 128 through the anode hole AH.

The bank 115g can be disposed on the anode 131, the second low-potential power line 128, and the second planarization layer 115f.

In addition, a spacer made of one of polyimide, photo acrylic, and benzocyclobutene can be disposed on an upper portion of the bank 115g.

The bank 115g can have the opening portion OP formed by removing a part of the bank 115g in the light-emitting area. A part of the anode 131 can be exposed through the opening portion OP.

In addition, the bank 115g can include the third contact hole formed by removing a part of the bank 115g in the hole area HA in the non-display area NA. A part of the connection electrode 136 can be exposed through the third contact hole.

The bank 115g can be disposed to extend to a part of the non-display area NA and inclined along the inclined side surface of the second planarization layer 115f. However, the present disclosure is not limited thereto.

Meanwhile, the trench pattern 255 can be formed by removing a part of the thickness of the second planarization layer 115f and removing a part of the bank 115g in a region adjacent to the inclined side surface of the bank 115g.

The trench pattern 255 can be positioned outside the anode hole AH.

The trench pattern 255 can have a depth of about 2 μm to 3.0 μm and a width of about 3.0 μm. However, the present disclosure is not limited thereto.

The trench pattern 255 can be provided in the form of a quadrangular frame that surrounds the display area AA.

Meanwhile, the stopper 140 can be disposed on the bank 115g in the non-display area NA.

The stopper 140 can be formed by the same process as the spacer. However, the present disclosure is not limited thereto.

The stopper 140 can be provided between the anode hole AH and the trench pattern 255 and disposed on the bank 115g.

The stopper 140 can be provided in the form of a quadrangular frame that surrounds the display area AA.

FIG. 7 illustrates the single stopper 140, but the present disclosure is not limited thereto. A plurality of stoppers 140 can be provided. Also FIG. 7 illustrates the stopper 140 having a regular tapered shape, but the present disclosure is not limited thereto. The stopper 140 can have an inverted tapered shape.

The stopper 140 can have a height that can control a flow of the organic material layer 150b.

The light-emitting part 132 can be disposed between the anode 131 and the cathode 133.

The light-emitting part 132 can be disposed to extend to a boundary between the display area AA and the non-display area NA. However, the present disclosure is not limited thereto.

The cathode 133 can be disposed on the light-emitting part 132.

The cathode 133 can be disposed to extend to a part of the non-display area NA so as to cover the light-emitting part 132. However, the present disclosure is not limited thereto.

The cathode 133 extending to a part of the non-display area NA can be electrically connected to the connection electrode 136 through the third contact hole.

The sealing layer 150 can be disposed on an upper portion of the light-emitting element 130.

The sealing layer 150 can include a plurality of layers including the first inorganic material layer 150a, the second inorganic material layer 150c, and the organic material layer 150b.

The first inorganic material layer 150a can be disposed to extend to a part of the non-display area NA.

The first inorganic material layer 150a can be disposed to cover the top surface and the side surface of the stopper 140 and cover the inner surface of the trench pattern 255.

The first inorganic material layer 150a can be disposed to cover the inclined side surface of the bank 115g and the side surface of the second planarization layer 115f.

Therefore, the first inorganic material layer 150a extending to a part of the non-display area NA can be inclined along the inclined side surface of the second planarization layer 115f. However, the present disclosure is not limited thereto.

The organic material layer 150b can be disposed on the first inorganic material layer 150a.

The organic material layer 150b can be disposed to a position before the stopper 140. For example, the flow of the organic material layer 150b can be controlled by the stopper 140, thereby suppressing an overflow of the organic material layer 150b. The trench pattern 255 is disposed outside the stopper 140 and has a large depth formed by removing a part of the thickness of the second inorganic material layer 150c. Therefore, even though the organic material layer 150b flows over the stopper 140, the overflowing organic material layer 150b can be trapped in the trench pattern 255 and may not overflow any further. In this case, it is possible to more effectively suppress the overflow in comparison with the first embodiment.

The second inorganic material layer 150c can be disposed on the organic material layer 150b and the first inorganic material layer 150a.

The second inorganic material layer 150c can be disposed to extend to a part of the non-display area NA, so that a part of the first planarization layer 115e can be exposed. However, the present disclosure is not limited thereto.

In this case, the second inorganic material layer 150c extending to a part of the non-display area NA can be inclined along the inclined side surface of the second planarization layer 115f. However, the present disclosure is not limited thereto.

Figure 9A:
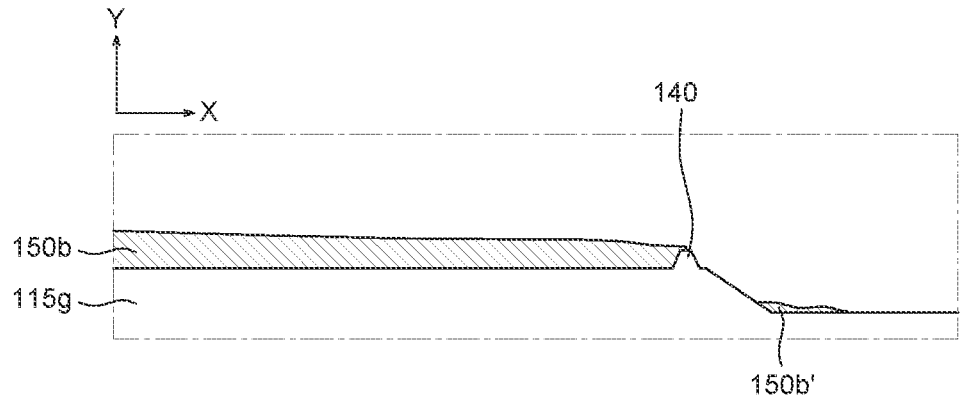
FIGS. 9A and 9B are views illustrating simulation results showing a flow of an organic substance layer.
Figure 9B:
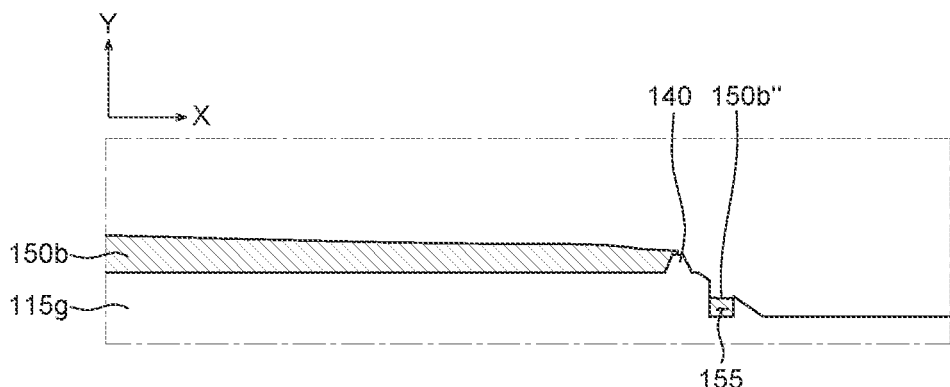

FIGS. 9A and 9B are views illustrating simulation results showing a flow of an organic substance layer.

FIGS. 10A and 10B are tables showing process conditions applied to simulations illustrated in FIGS. 9A and 9B.

Particularly, FIG. 9A illustrates a flow of the organic material layer 150b when only the stopper 140 is provided.

In addition, FIG. 9B illustrates a flow of the organic material layer 150b when the stopper 140 and the trench pattern 155 are provided.

Referring to FIGS. 10A and 10B, a dropping height of the organic material layer 150b used for the simulation was set to 500 μm, dropping pitches x and z were set to 40 μm and 31.75 μm, and a dropping position x was set to about 83 μm.

In addition, the discharge amount of the organic material layer 150b was set to 12 pL, and a dropping speed was set to 500 mm/sec.

In this case, density, viscosity, surface tension, and a contact angle with the substrate of used ink were set to 1.118 g/mL, 10.3 mPa·s, 24.8 mN/m, and 7.1 deg, respectively. In addition, a height of the stopper 140 was set to about 1.0 μm.

Referring to FIGS. 9A and 9B, according to the result of the simulation performed in the same process condition by using the same material, it can be seen that a part 150b' of the organic material layer 150b overflows to the outer side of the stopper 140 when only the stopper 140 is provided, but a part 150b" of the overflowing organic material layer 150b is trapped in the trench pattern 155 and does not overflow any further when the stopper 140 and the trench pattern 155 are provided.

Meanwhile, the stopper according to the present disclosure can have an inverted tapered shape. This configuration will be described in detail with reference to FIG. 11.

Figure 11:
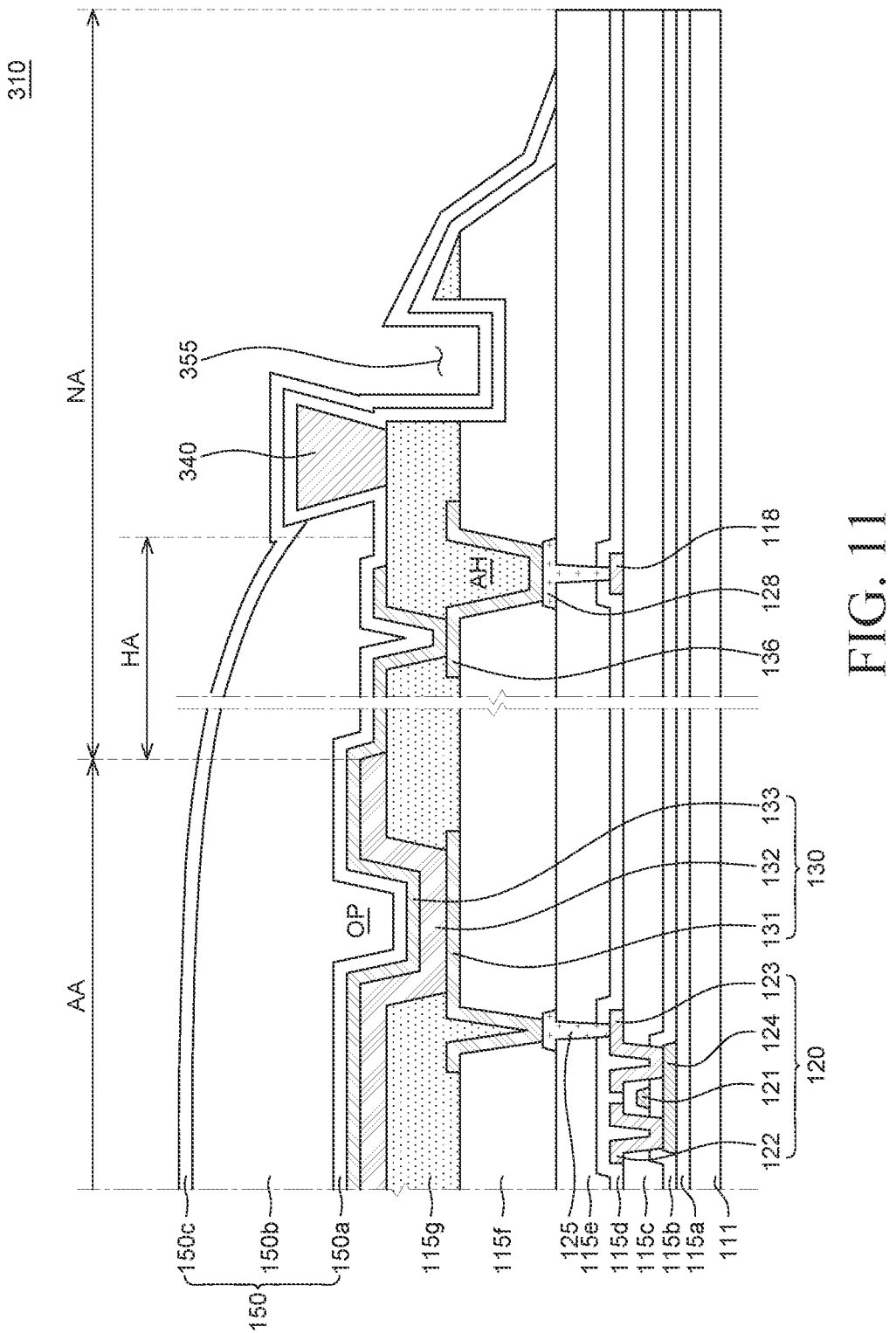
FIG. 11 is a cross-sectional view of a display panel according to a third embodiment of the present disclosure.

FIG. 11 is a cross-sectional view of a display panel according to a third embodiment of the present disclosure.

The third embodiment illustrated in FIG. 11 is substantially identical in configuration to the second embodiment illustrated in FIG. 7, except that a stopper 340 has an inverted tapered shape. Therefore, repeated descriptions of the identical components will be omitted or may be briefly provided. The same reference numerals are used for the same components.

Referring to FIG. 11, a display panel 310 according to the third embodiment of the present disclosure can include the display area AA and the non-display area NA.

In the third embodiment of the present disclosure, the stopper 340 and a trench pattern 355 are formed in the non-display area NA at the outer periphery of the display area AA in order to control the flow of the organic material layer. Therefore, a dam in the related art can be removed, and the bezel width can be reduced.

The stopper 340 can be formed on the bank 115g in the end tapered region of the second planarization layer 115f. The trench pattern 355 can be formed by removing a part of a thickness of the second planarization layer 115f and removing a part of the bank 115g provided outside the stopper 340.

In particular, in the third embodiment of the present disclosure, the stopper 340 has an inverted tapered shape. For example, the stopper 340 having the inverted tapered shape can be disposed on the bank 115g in the non-display area NA.

The stopper 340 can be provided between the anode hole AH and the trench pattern 355 and disposed on the bank 115g.

The stopper 340 can be provided in the form of a quadrangular frame that surrounds the display area AA.

The stopper 340 can have a height that can control a flow of the organic material layer 150b.

Meanwhile, the first inorganic material layer 150a can be disposed to cover a top surface and a side surface of the stopper 340. However, the present disclosure is not limited thereto. For example, because the stopper 340 has the inverted tapered shape, the first inorganic material layer 150*a* may not completely cover the side surface of the stopper 340.

In addition, the first inorganic material layer 150*a* can be disposed to cover an inner surface of the trench pattern 355, the inclined side surface of the bank 115*g*, and the side surface of the second planarization layer 115*f*.

The organic material layer 150*b* can be disposed to a position before the stopper 340. For example, the flow of the organic material layer 150*b* can be controlled by the stopper 340, thereby suppressing an overflow of the organic material layer 150*b*. In particular, because the stopper 340 according to the third embodiment has the inverted tapered shape, it is possible to effectively inhibit the organic material layer 150*b* from flowing over the stopper 340.

Meanwhile, according to the present disclosure, an undercut structure can be formed in a bank at an outer periphery of a non-display area to suppress an overflow of an organic material layer. This configuration will be described in detail with reference to FIGS. 12 to 16.

Figure 12:
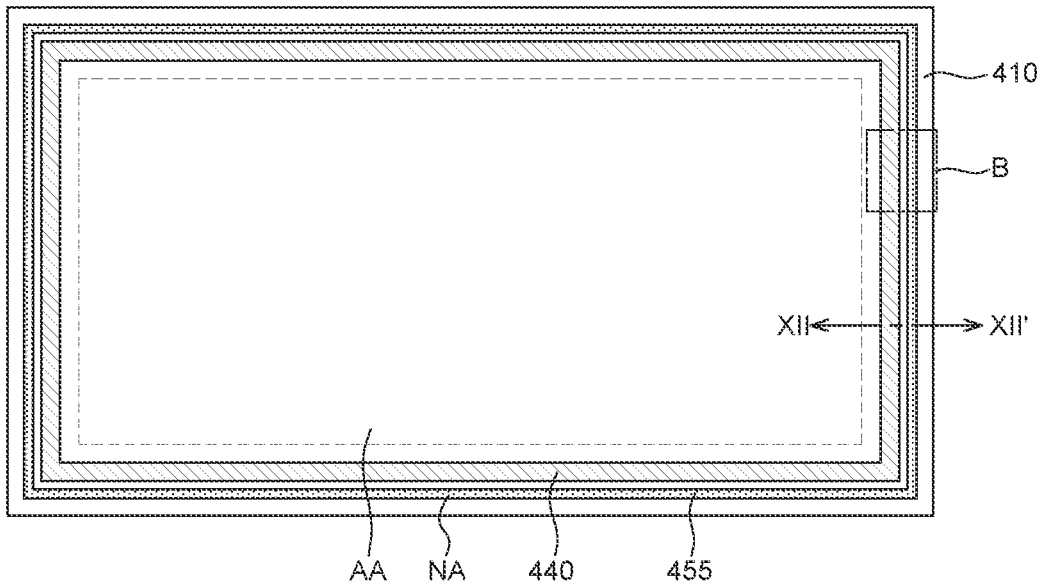
FIG. 12 is a top plan view of an electroluminescent display device according to a fourth embodiment of the present disclosure.

FIG. 12 is a top plan view of an electroluminescent display device according to a fourth embodiment of the present disclosure.

Figure 13:
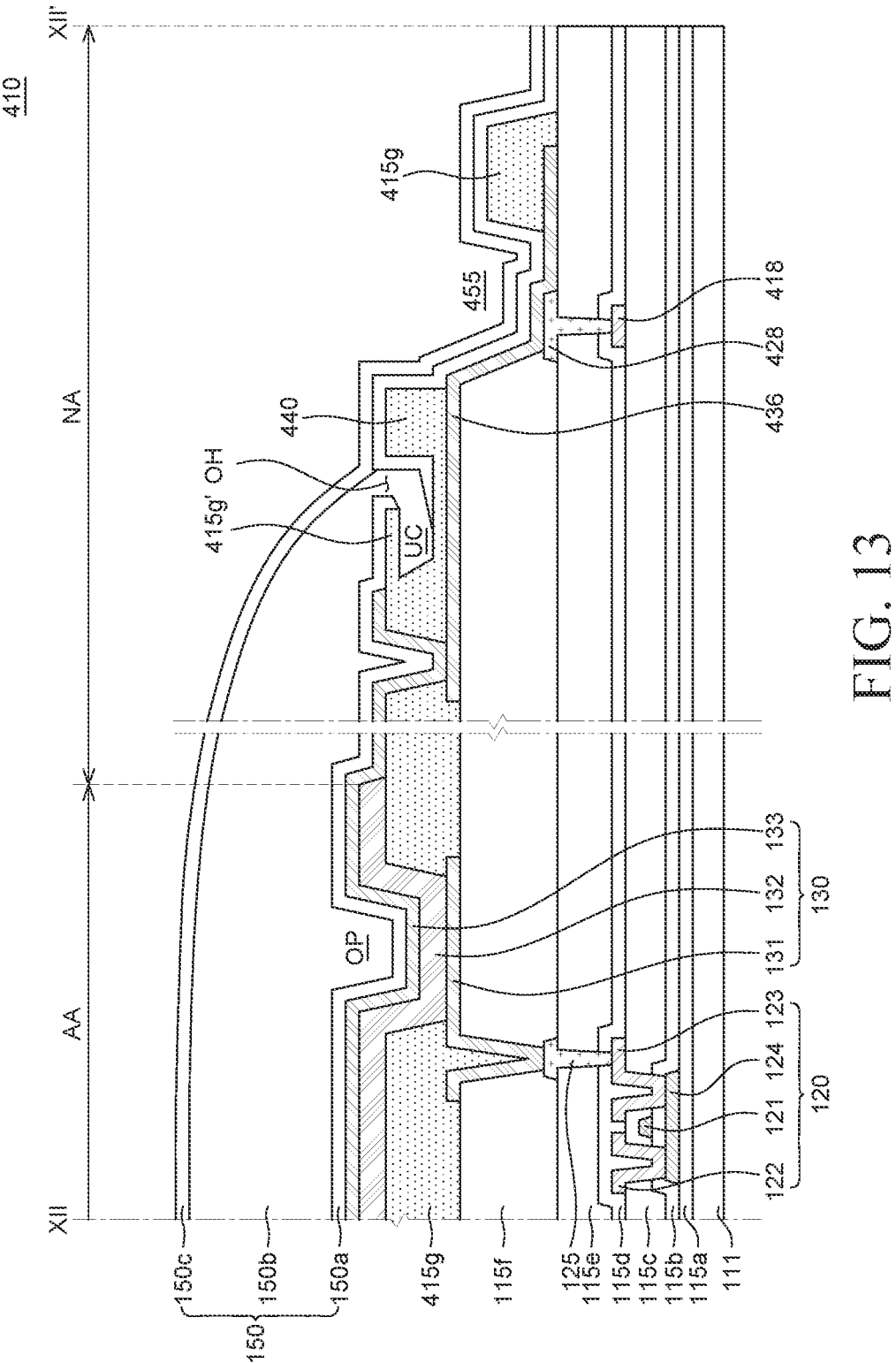
FIG. 13 is a cross-sectional view taken along line XII-XII' in FIG. 12.

FIG. 13 is a cross-sectional view taken along line XII-XII' in FIG. 12.

Figure 14:
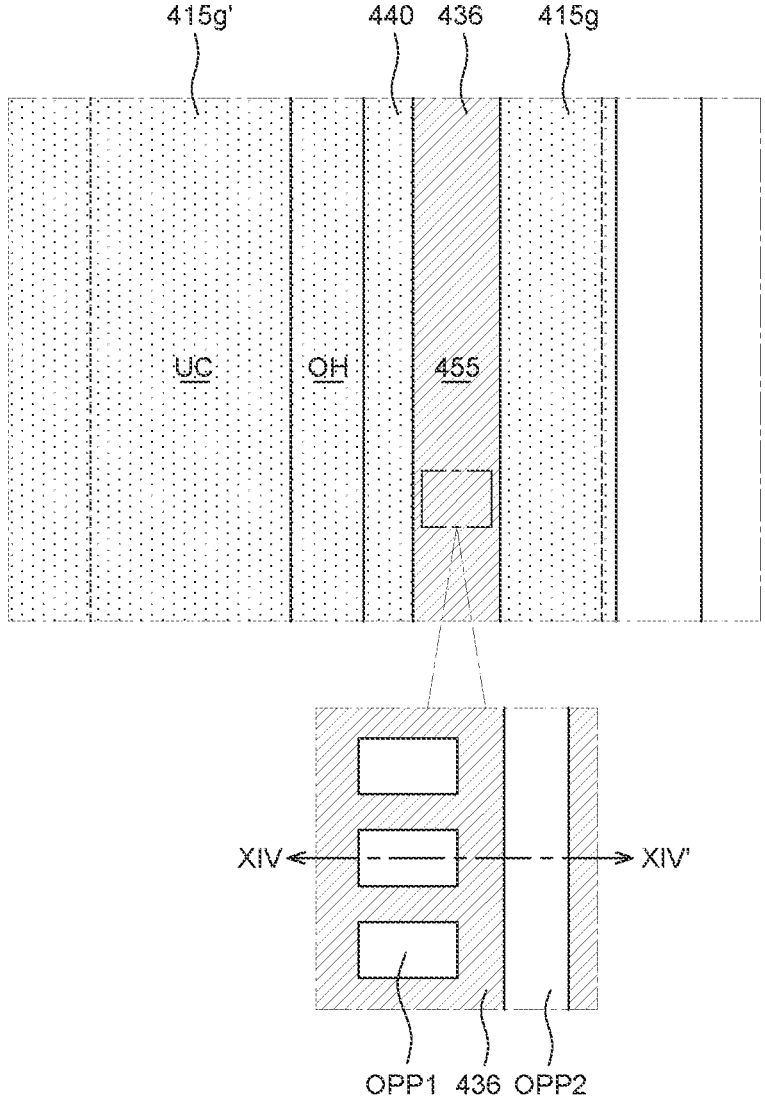
FIG. 14 is an enlarged view schematically illustrating part B in FIG. 12.

FIG. 14 is an enlarged view schematically illustrating part B in FIG. 12.

Figure 15:
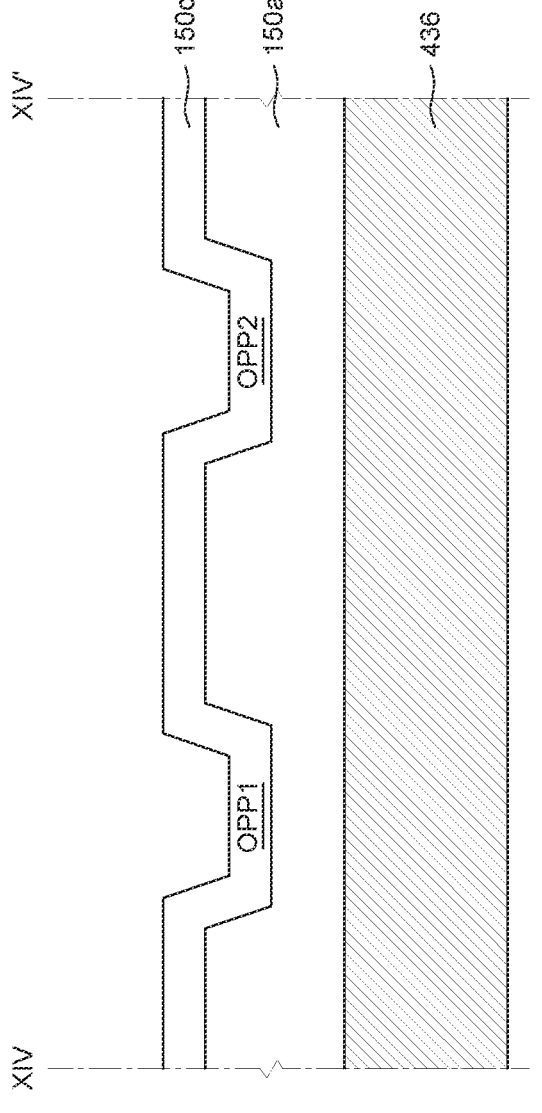
FIG. 15 is a cross-sectional view taken along line XIV-XIV' in FIG. 14.

FIG. 15 is a cross-sectional view taken along line XIV-XIV' in FIG. 14.

The fourth embodiment illustrated in FIGS. 12 to 15 is substantially identical in configuration to the first embodiment illustrated in FIGS. 5 and 6, except for a shape of a trench pattern 455 and a bank 415*g* at the outer periphery of the non-display area NA. Therefore, repeated descriptions of the identical components will be omitted or may be briefly provided. The same reference numerals are used for the same components.

Referring to FIGS. 12 to 15, an electroluminescent display device 400 according to the fourth embodiment of the present disclosure can include a display panel 410, a flexible film, and a printed circuit board.

The display panel 410 can include a display area AA and a non-display area NA.

In the fourth embodiment of the present disclosure, an undercut structure UC is formed in the bank 415*g* in the non-display area NA at the outer periphery of the display area AA, a part of the bank 415*g* is used as a stopper 440, and the trench pattern 455 is formed outside the stopper 440 in order to control the flow of the organic material layer 150*b*. Therefore, a dam in the related art can be removed, and the bezel width can be reduced.

The stopper 440 can be disposed adjacent to the end tapered region of the second planarization layer 115*f*. The trench pattern 455 can be formed by removing the second planarization layer 115*f* and a part of the bank 415*g* disposed outside the stopper 440.

Specifically, the substrate 111 can be divided into the display area AA and the non-display area NA at the outer periphery of the display area AA.

The thin-film transistor 120, the light-emitting element 130, and the sealing layer 150 can be formed in the display area AA of the substrate 111.

The stopper 440, the trench pattern 455, and a part of the sealing layer 150 can be formed in the non-display area NA of the substrate 111.

The thin-film transistor 120 can be disposed on the upper portion of the flexible substrate 111 and include the gate electrode 121, the source electrode 122, the drain electrode 123, and the semiconductor layer 124.

Meanwhile, a first low-potential power line 418 can be disposed on the second insulating layer 115*c* in the non-display area NA and apply a low-potential voltage to the cathode 133.

The protective layer 115*d* and the first planarization layer 115*e* can be disposed on the thin-film transistor 120 and the first low-potential power line 418.

An intermediate electrode 125 can be connected to the thin-film transistor 120 through the first contact hole formed in the first planarization layer 115*e* and the protective layer 115*d*.

In addition, the second contact hole can be formed in the first planarization layer 115*e* and the protective layer 115*d* in the non-display area NA, and a part of the first low-potential power line 418 can be exposed through the second contact hole. A second low-potential power line 428 can be electrically connected to the first low-potential power line 418 through the second contact hole.

Like the first to third embodiments, the first planarization layer 115*e* and the insulating layer disposed below the first planarization layer 115*e* can be disposed to extend to the end of the substrate 111 in the non-display area NA. However, the present disclosure is not limited thereto.

The second planarization layer 115*f* can be disposed on the first planarization layer 115*e*.

The second planarization layer 115*f* can be disposed to extend to a part of the non-display area NA. For example, the second planarization layer 115*f* is not formed at the outer side of the stopper 440, so that a part of the second low-potential power line 428 can be exposed. However, the present disclosure is not limited thereto.

The side surface of the second planarization layer 115*f* extending to a part of the non-display area NA can be inclined. However, the present disclosure is not limited thereto.

The light-emitting element 130 including the anode 131, the light-emitting part 132, and the cathode 133 can be disposed on the second planarization layer 115*f*.

A connection electrode 436 can be disposed on the second planarization layer 115*f* in the non-display area NA, extend to the inclined side surface of the second planarization layer 115*f*, and be electrically connected to the second low-potential power line 428.

The bank 415*g* can be disposed on the anode 131, the second low-potential power line 428, and the second planarization layer 115*f*.

In addition, a spacer made of one of polyimide, photo acrylic, and benzocyclobutene can be disposed on an upper portion of the bank 415*g*.

The bank 415*g* can have an opening portion OP formed by removing a part of the bank 415*g* in the light-emitting area. A part of the anode 131 can be exposed through the opening portion OP.

In addition, the undercut structure UC is formed by removing a part of the bank 415*g* in the non-display area NA. A part of the bank 415*g* disposed outside the undercut structure UC can be used as the stopper 440.

For example, the undercut structure UC is formed in the non-display area NA by removing a part of the bank 415*g* in the non-display area NA, such that an eave structure 415*g*' protruding outward can be formed above the undercut structure UC and cover the undercut structure UC. In addition, the stopper 440 can be formed outside the undercut structure UC and disposed to be spaced apart from the eave structure 415*g*' at a predetermined interval with an open hole OH interposed therebetween. The open hole OH serves as an inflow passageway of the organic material layer 150b.

The undercut structure UC and the stopper 440 can each be provided in the form of a quadrangular frame that surrounds the display area AA.

Further, the bank 415g can include the trench pattern 455 formed by removing a part of the bank 415g provided in the non-display area NA and disposed outside the stopper 440, so that a part of the connection electrode 436 is exposed.

The bank 415g can be disposed to extend to a part of the non-display area NA, except for the trench pattern 455.

The trench pattern 455 can be positioned outside the stopper 440. The trench pattern 455 can be provided in the form of a quadrangular frame that surrounds the stopper 440.

FIG. 12 illustrates the stopper 440 having a regular tapered shape, but the present disclosure is not limited thereto. The stopper 140 can have an inverted tapered shape.

The stopper 440 can have a height that can control a flow of the organic material layer 150b.

The light-emitting part 132 can be disposed between the anode 131 and the cathode 133. The light-emitting part 132 can be disposed to extend to a boundary between the display area AA and the non-display area NA. However, the present disclosure is not limited thereto.

The cathode 133 can be disposed on the light-emitting part 132. The cathode 133 can be disposed to extend to a part of the non-display area NA so as to cover the light-emitting part 132. However, the present disclosure is not limited thereto.

The cathode 133 extending to a part of the non-display area NA can be electrically connected to the connection electrode 436 through the third contact hole.

The sealing layer 150 can be disposed on an upper portion of the light-emitting element 130. The sealing layer 150 can include a plurality of layers including the first inorganic material layer 150a, the second inorganic material layer 150c, and the organic material layer 150b.

The first inorganic material layer 150a can be disposed to extend to the end of the substrate 111. However, the present disclosure is not limited thereto.

The first inorganic material layer 150a can be disconnected by the undercut structure UC. The first inorganic material layer 150a can be disposed to cover the top surface and the side surface of the stopper 440 and cover the inner surface of the trench pattern 455.

In the fourth embodiment of the present disclosure, a predetermined pattern is formed on a surface of the first inorganic material layer 150a disposed to cover an inner surface of the trench pattern 455.

For example, a first anti-overflow pattern OPP1 and a second anti-overflow pattern OPP2 can be formed by removing a part of a thickness of the first inorganic material layer 150a disposed in the trench pattern 455.

The first anti-overflow pattern OPP1 can be provided in plural, and the plurality of first anti-overflow patterns OPP1 can be formed along the trench pattern 455. However, the present disclosure is not limited thereto. In addition, the second anti-overflow pattern OPP2 can be disposed outside the plurality of first anti-overflow patterns OPP1 and integrally formed along the trench pattern 455. However, the present disclosure is not limited thereto. In some instances, the first anti-overflow pattern OPP1 can be integrally formed along the trench pattern 455, the second anti-overflow pattern OPP2 can be provided in plural, and the plurality of second anti-overflow patterns OPP2 can be formed along the trench pattern 455.

The plurality of first anti-overflow patterns OPP1 can have different depths.

In this case, the first anti-overflow pattern OPP1 and the second anti-overflow pattern OPP2 can each be provided in the form of a quadrangular frame that surrounds the stopper 440 in the trench pattern 455.

The organic material layer 150b can be disposed on the first inorganic material layer 150a.

The organic material layer 150b can be disposed to a position before the stopper 440. For example, the flow of the organic material layer 150b can be controlled by the stopper 440, thereby suppressing an overflow of the organic material layer 150b. In addition, in the fourth embodiment of the present disclosure, even though the organic material layer 150b further overflows than a preset value, the organic material layer 150b is primarily introduced into the undercut structure UC. Even though the organic material layer 150b flows over the stopper 440, the organic material layer 150b is secondarily trapped in the trench pattern 455 disposed outside the stopper 440. Therefore, the organic material layer 150b does not overflow any further. For example, the flow of the overflowing organic material layer 150b can be more effectively controlled by the first and second anti-overflow patterns OPP1 and OPP2 in the trench pattern 455.

The second inorganic material layer 150c can be disposed on the organic material layer 150b and the first inorganic material layer 150a.

The second inorganic material layer 150c can be disposed to extend to the end of the substrate 111. However, the present disclosure is not limited thereto.

Figure 16:
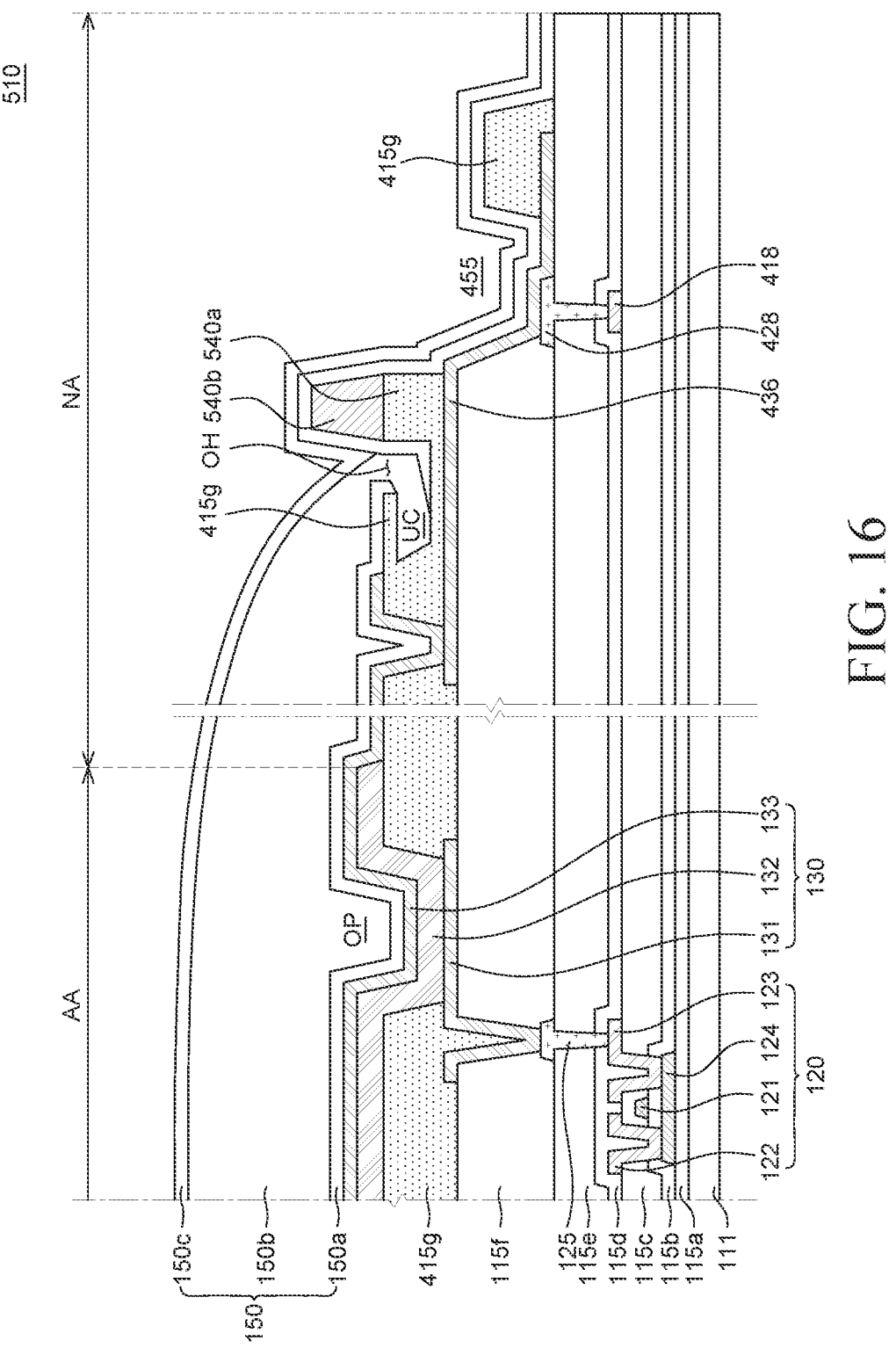
FIG. 16 is a cross-sectional view of a display panel according to a fifth embodiment of the present disclosure.

FIG. 16 is a cross-sectional view of a display panel according to a fifth embodiment of the present disclosure.

The fifth embodiment illustrated in FIG. 16 is substantially identical in configuration to the fourth embodiment illustrated in FIG. 13, except for structures of stoppers 540a and 540b. Therefore, repeated descriptions of the identical components will be omitted or may be briefly provided. The same reference numerals are used for the same components.

Referring to FIG. 16, a display panel 510 according to the fifth embodiment of the present disclosure can include the display area AA and the non-display area NA.

In the fifth embodiment of the present disclosure, the undercut structure UC is formed in the bank 415g of the non-display area NA, and a part of the bank 415g is used as the first stopper 540a. Further, a second stopper 540b is additionally formed on the first stopper 540a, and the trench pattern 455 is formed outside the first and second stoppers 540a and 540b, thereby controlling the flow of the organic material layer 150b. Therefore, it is possible to reduce the bezel width.

The first stopper 540a can be disposed adjacent to the end tapered region of the second planarization layer 115f. The trench pattern 455 can be formed by removing the second planarization layer 115f and a part of the bank 415g disposed outside the first stopper 540a.

Like the first to fourth embodiments, the first planarization layer 115e and the insulating layer disposed below the first planarization layer 115e can be disposed to extend to the end of the substrate 111 in the non-display area NA. However, the present disclosure is not limited thereto.

The second planarization layer 115f can be disposed on the first planarization layer 115e.

The second planarization layer 115f can be disposed to extend to a part of the non-display area NA. For example, the second planarization layer 115f is not formed at the outer side of the first stopper 540a, so that a part of the second low-potential power line 428 can be exposed. However, the present disclosure is not limited thereto.

The side surface of the second planarization layer 115*f* extending to a part of the non-display area NA can be inclined. However, the present disclosure is not limited thereto.

The light-emitting element 130 including the anode 131, the light-emitting part 132, and the cathode 133 can be disposed on the second planarization layer 115*f.*

The connection electrode 436 can be disposed on the second planarization layer 115*f* in the non-display area NA, extend to the inclined side surface of the second planarization layer 115*f,* and be electrically connected to the second low-potential power line 428.

The bank 415*g* can be disposed on the anode 131, the second low-potential power line 428, and the second planarization layer 115*f.*

In addition, a spacer made of one of polyimide, photo acrylic, and benzocyclobutene can be disposed on an upper portion of the bank 415*g.*

The bank 415*g* can have the opening portion OP formed by removing a part of the bank 415*g* in the light-emitting area. A part of the anode 131 can be exposed through the opening portion OP.

In addition, the undercut structure UC is formed by removing a part of the bank 415*g* in the non-display area NA. A part of the bank 415*g* disposed outside the undercut structure UC can be used as the first stopper 540*a.*

For example, the undercut structure UC is formed in the non-display area NA by removing a part of the bank 415*g* in the non-display area NA, so that the eave structure 415*g'* protruding outward can be formed above the undercut structure UC and cover the undercut structure UC. In addition, the first stopper 540*a* can be formed outside the undercut structure UC and disposed to be spaced apart from the eave structure 415*g'* at a predetermined interval with the open hole OH interposed therebetween. The open hole OH serves as an inflow passageway of the organic material layer 150*b.*

In addition, the second stopper 540*b* can be disposed on the first stopper 540*a.*

The second stopper 540*b* can be formed by the same process as the spacer. However, the present disclosure is not limited thereto.

The undercut structure UC and the first and second stoppers 540*a* and 540*b* can each be provided in the form of a quadrangular frame that surrounds the display area AA.

In this case, the trench pattern 455 can be formed by removing a part of the bank 415*g* provided in non-display area NA and disposed outside the first and second stoppers 540*a* and 540*b,* so that a part of the connection electrode 436 is exposed.

The bank 415*g* can be disposed to extend to a part of the non-display area NA, except for the trench pattern 455.

The trench pattern 455 can be positioned outside the first and second stoppers 540*a* and 540*b.*

The trench pattern 455 can be provided in the form of a quadrangular frame that surrounds the first and second stoppers 540*a* and 540*b.*

FIG. 16 illustrates the first and second stoppers 540*a* and 540*b* each having a regular tapered shape, but the present disclosure is not limited thereto. The first and second stoppers 540*a* and 540*b* can each have an inverted tapered shape.

The first and second stoppers 540*a* and 540*b* can each have a height that can control a flow of the organic material layer 150*b.*

The first inorganic material layer 150*a* can be disposed to extend to the end of the substrate 111. However, the present disclosure is not limited thereto.

The first inorganic material layer 150*a* can be disconnected by the undercut structure UC. The first inorganic material layer 150*a* can be disposed to cover the side surfaces of the first and second stoppers 540*a* and 540*b* and the top surface of the second stopper 540*b* and cover the inner surface of the trench pattern 455.

In this case, in the fifth embodiment of the present disclosure, like the fourth embodiment, a predetermined pattern is formed on a surface of the first inorganic material layer 150*a* disposed to cover the inner surface of the trench pattern 455.

For example, a first anti-overflow pattern and a second anti-overflow pattern can be formed by removing a part of a thickness of the first inorganic material layer 150*a* disposed in the trench pattern 455.

The first anti-overflow pattern can be provided in plural, and the plurality of first anti-overflow patterns can be formed along the trench pattern 455. However, the present disclosure is not limited thereto. In addition, the second anti-overflow pattern can be disposed outside the plurality of first anti-overflow patterns and integrally formed along the trench pattern 455. However, the present disclosure is not limited thereto.

The plurality of first anti-overflow patterns can have different depths.

In this case, the first anti-overflow pattern and the second anti-overflow pattern can each be provided in the form of a quadrangular frame that surrounds the first and second stoppers 540*a* and 540*b* in the trench pattern 455.

The organic material layer 150*b* can be disposed on the first inorganic material layer 150*a.* The organic material layer 150*b* can be disposed to a position before the first and second stoppers 540*a* and 540*b.*

The second inorganic material layer 150*c* can be disposed on the organic material layer 150*b* and the first inorganic material layer 150*a.*

The second inorganic material layer 150*c* can be disposed to extend to the end of the substrate 111. However, the present disclosure is not limited thereto.

The exemplary embodiments of the present disclosure can also be described as follows:

According to an aspect of the present disclosure, there is provided an electroluminescent display device. The electroluminescent display device includes a substrate including a display area and a non-display area, a planarization layer disposed on an upper portion of the substrate, a bank disposed on the planarization layer; a stopper disposed on the bank in the non-display area, at least one trench pattern disposed outside the stopper and configured by removing a partial region of the bank such that the planarization layer is exposed and a sealing layer disposed above the substrate.

According to another aspect of the present disclosure, there is provided an electroluminescent display device. The electroluminescent display device includes a substrate including a display area and a non-display area, a planarization layer disposed on an upper portion of the substrate, a bank disposed on the planarization layer, an undercut provided in the bank in the non-display area, a stopper configured (or defined) by the bank and disposed outside the undercut, at least one trench pattern disposed outside the stopper and configured by removing a partial region of the bank and a sealing layer disposed above the substrate.

The electroluminescent display device can further include a thin-film transistor disposed on the upper portion of the substrate in the display area, a first low-potential power line disposed on the upper portion of the substrate in the non-display area and a protective layer disposed on the thin-film transistor and the first low-potential power line.

The planarization layer can include a first planarization layer disposed on the protective layer and a second planarization layer disposed on the first planarization layer.

The electroluminescent display device can further include a second low-potential power line disposed on the first planarization layer in the non-display area and connected to the first low-potential power line and a connection electrode disposed on the second planarization layer in the non-display area and connected to the second low-potential power line.

The second planarization layer can be disposed to extend to a part of the non-display area so that a part of the first planarization layer is exposed, and a side surface of the second planarization layer extending to a part of the non-display area can be inclined.

The electroluminescent display device can further include an anode disposed on the second planarization layer in the display area, a light-emitting part provided on the anode and disposed to extend to a boundary between the display area and the non-display area and a cathode disposed to extend to a part of the non-display area, configured to cover the light-emitting part, and electrically connected to the connection electrode.

The bank can be disposed to extend to a part of the non-display area and inclined along the inclined side surface of the second planarization layer, and the trench pattern can be configured by removing a part of the bank adjacent to an inclined side surface of the bank so that the second planarization layer is exposed.

The trench pattern can be configured by removing a part of a thickness of the second planarization layer and the bank.

The sealing layer can include a first inorganic material layer, an organic material layer disposed on the first inorganic material layer and a second inorganic material layer disposed on the organic material layer, and the first inorganic material layer can extend to a part of the non-display area and can be disposed to cover a top surface and a side surface of the stopper and an inner surface of the trench pattern.

The first inorganic material layer can be disposed to cover the side surface of the second planarization layer and the inclined bank, and the first inorganic material layer extending to a part of the non-display area can be inclined along the inclined side surface of the second planarization layer.

The organic material layer can be disposed to a position before the stopper.

The organic material layer can be trapped in the trench pattern even when the organic material layer flows over the stopper.

The trench pattern can be provided in the form of a quadrangular frame that surrounds the display area.

The stopper can be provided in the form of a quadrangular frame that surrounds the display area.

The stopper can have an inverted tapered shape.

The trench pattern can include a first trench pattern at a relatively inner side and a second trench pattern positioned at a relatively outer side, and the first trench pattern can have a larger depth than the second trench pattern.

The undercut can be configured in the bank by removing a part of the bank in the non-display area, and the bank can comprise an eave structure configured above the undercut and protruding outward to cover the undercut.

The stopper can be disposed to be spaced apart from the eave structure at a predetermined interval with an open hole interposed therebetween, and the open hole can be provided outside the undercut.

The undercut and the stopper can be each provided in the form of a quadrangular frame that surrounds the display area.

The sealing layer can include a first inorganic material layer, an organic material layer disposed on the first inorganic material layer and a second inorganic material layer disposed on the organic material layer, and the electroluminescent display device can further include an anti-overflow pattern configured by removing a part of a thickness of the first inorganic material layer disposed on an inner surface of the trench pattern.

The anti-overflow pattern can include a plurality of first anti-overflow patterns configured along the trench pattern and a second anti-overflow pattern disposed outside the plurality of first anti-overflow patterns and integrally configured along the trench pattern.

The plurality of first anti-overflow patterns can have different depths.

The first anti-overflow pattern and the second anti-overflow pattern can be each provided in the form of a quadrangular frame that surrounds the stopper in the trench pattern.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device comprising:
   a substrate including a display area and a non-display area;
   a planarization layer disposed on an upper portion of the substrate;
   a bank disposed on the planarization layer;
   a stopper disposed on the bank in the non-display area;
   at least one trench pattern disposed outside the stopper and configured by removing a partial region of the bank so that the planarization layer is exposed,
   wherein the at least one trench pattern comprises a first trench pattern located outside the stopper and a second trench pattern located outside the first trench pattern,
   wherein the first trench pattern and the second trench pattern each expose a top surface of the planarization layer, and
   wherein the first trench pattern has a greater depth than the second trench pattern; and
   a sealing layer disposed above the substrate.

2. The electroluminescent display device of claim 1, further comprising:
   a thin-film transistor disposed on the upper portion of the substrate in the display area;

a first low-potential power line disposed on the upper portion of the substrate in the non-display area; and a protective layer disposed on the thin-film transistor and the first low-potential power line.

3. The electroluminescent display device of claim 2, wherein the planarization layer comprises:

a first planarization layer disposed on the protective layer; and a second planarization layer disposed on the first planarization layer.

4. The electroluminescent display device of claim 3, further comprising:

a second low-potential power line disposed on the first planarization layer in the non-display area and connected to the first low-potential power line; and a connection electrode disposed on the second planarization layer in the non-display area and connected to the second low-potential power line.

5. The electroluminescent display device of claim 4, wherein the second planarization layer is disposed to extend to a part of the non-display area so that a part of the first planarization layer is exposed, and wherein a side surface of the second planarization layer extending to a part of the non-display area is inclined.

6. The electroluminescent display device of claim 5, further comprising:

an anode disposed on the second planarization layer in the display area;

a light-emitting part provided on the anode and disposed to extend to a boundary between the display area and the non-display area; and a cathode disposed to extend to a part of the non-display area, configured to cover the light-emitting part, and electrically connected to the connection electrode.

7. The electroluminescent display device of claim 5, wherein the bank is disposed to extend to a part of the non-display area and inclined along the inclined side surface of the second planarization layer, and wherein the at least one trench pattern is configured by removing a part of the bank adjacent to an inclined side surface of the bank so that the second planarization layer is exposed.

8. The electroluminescent display device of claim 7, wherein the sealing layer comprises:

a first inorganic material layer;

an organic material layer disposed on the first inorganic material layer; and a second inorganic material layer disposed on the organic material layer, and wherein the first inorganic material layer extends to a part of the non-display area, and is disposed to cover a top surface and a side surface of the stopper and an inner surface of the at least one trench pattern.

9. The electroluminescent display device of claim 8, wherein the first inorganic material layer is disposed to cover the inclined side surface of the second planarization layer and the inclined bank, and wherein the first inorganic material layer extending to a part of the non-display area is inclined along the inclined side surface of the second planarization layer.

10. The electroluminescent display device of claim 8, wherein the organic material layer is disposed to a position before the stopper.

11. The electroluminescent display device of claim 8, wherein the organic material layer is trapped in the at least one trench pattern even when the organic material layer flows over the stopper.

12. The electroluminescent display device of claim 1, wherein the at least one trench pattern is provided in the form of a quadrangular frame that surrounds the display area.

13. The electroluminescent display device of claim 12, wherein the stopper is provided in the form of a quadrangular frame that surrounds the display area.

14. The electroluminescent display device of claim 1, wherein the bank disposed between the first trench pattern and the second trench pattern has a bottom surface facing the substrate, an upper surface opposing the bottom surface, and side surfaces connecting the bottom surface and upper surface, and wherein the upper surface of the bank disposed between the first trench pattern and the second trench pattern is inclined.

15. The electroluminescent display device of claim 1, wherein the first trench pattern and the second trench pattern both extend below a bottom surface of the stopper, the bottom surface of the stopper facing the substrate.

* * * * *